(12) United States Patent
Stenzel et al.

(10) Patent No.: US 10,557,081 B2
(45) Date of Patent: Feb. 11, 2020

(54) LIGHT-CONVERTING MATERIAL

(71) Applicant: Merck Patent GmbH, Darmstadt (DE)

(72) Inventors: Norbert Stenzel, Lampertheim (DE); Andrea Opolka, Suederholz (DE); Bernhard Rieger, Muenster-Altheim (DE); Stefan Tews, Greifswald (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 15/758,812

(22) PCT Filed: Aug. 17, 2016

(86) PCT No.: PCT/EP2016/001403
§ 371 (c)(1),
(2) Date: Mar. 9, 2018

(87) PCT Pub. No.: WO2017/041875
PCT Pub. Date: Mar. 16, 2017

(65) Prior Publication Data
US 2019/0085239 A1     Mar. 21, 2019

(30) Foreign Application Priority Data

Sep. 10, 2015 (EP) .................................... 15184670

(51) Int. Cl.
*C09K 11/88* (2006.01)
*C09K 11/02* (2006.01)
(Continued)

(52) U.S. Cl.
CPC ............ *C09K 11/883* (2013.01); *C09K 11/02* (2013.01); *C09K 11/025* (2013.01);
(Continued)

(58) Field of Classification Search
None
See application file for complete search history.

(56) References Cited

U.S. PATENT DOCUMENTS 8,062,421 B2   11/2011  Alivisatos
2004/0219221 A1*  11/2004  Moore ................... B01D 9/005
                                                        424/489

(Continued)

FOREIGN PATENT DOCUMENTS

DE   102011082774 A1   3/2012
EP       1516944 A1    3/2005
(Continued)

OTHER PUBLICATIONS

International Search Report PCT/EP2016/001403 dated Dec. 1, 2016.

(Continued)

*Primary Examiner* — Raj R Gupta
(74) *Attorney, Agent, or Firm* — Millen White Zelano and Branigan, PC

(57) ABSTRACT

The present invention relates to light-converting materials which comprise semiconductor nanoparticles and an unactivated crystalline material, where the semiconductor nanoparticles are located on the surface of the unactivated crystalline material. The present invention furthermore relates to the use of the light-converting material in a light source. The present invention furthermore relates to a light-converting mixture, to a light source, to a lighting unit which contains the light-converting material according to the invention, and to a process for the production of the light source.

30 Claims, 3 Drawing Sheets

(51) Int. Cl.
   *C09K 11/56* (2006.01)
   *H01L 33/50* (2010.01)
   *B82Y 30/00* (2011.01)
   *B82Y 20/00* (2011.01)
   *B82Y 40/00* (2011.01)

(52) U.S. Cl.
   CPC .......... *C09K 11/565* (2013.01); *H01L 33/502* (2013.01); *B82Y 20/00* (2013.01); *B82Y 30/00* (2013.01); *B82Y 40/00* (2013.01); *H01L 33/504* (2013.01); *H01L 2933/0041* (2013.01)

(56) References Cited

U.S. PATENT DOCUMENTS

| | | | |
|---|---|---|---|
| 2007/0007511 A1* | 1/2007 | Choi | B82Y 30/00 257/40 |
| 2013/0026506 A1* | 1/2013 | Arbell | C09K 11/02 257/88 |
| 2015/0014728 A1* | 1/2015 | Do | C09K 11/565 257/98 |

FOREIGN PATENT DOCUMENTS

| | | |
|---|---|---|
| EP | 1401551 B1 | 6/2006 |
| EP | 1741484 A1 | 1/2007 |
| EP | 2319613 A1 | 5/2011 |
| EP | 2811001 A1 | 12/2014 |
| EP | 2528989 B1 | 3/2015 |
| WO | 2011092646 A2 | 8/2011 |
| WO | 2011092647 A2 | 8/2011 |
| WO | 2014140936 A2 | 9/2014 |

OTHER PUBLICATIONS

M. J. Anc; N. L. Pickett et al., ECS Journal of Solid State Science and Technology, vol. 2, No. 2, 2013, pp. R3071-R3082.

Jan Ziegler et al.: "Silica-Coated InP/ZnS Nanocrystals as Converter Material in White LEDs", Advanced Materials, vol. 20, No. 21, Oct. 13, 2008 (Oct. 13, 2008), pp. 4068-4073, XP002639985.

\* cited by examiner

LIGHT-CONVERTING MATERIAL

SUBJECT-MATTER OF THE INVENTION

The present invention relates to a light-converting material which comprises an unactivated crystalline material and semiconductor nanoparticles (quantum materials) which are located on the surface of the unactivated crystalline material. The present invention furthermore relates to the use of the light-converting material as conversion material for the partial or complete conversion of ultraviolet and/or blue light into light having a longer wavelength. The present invention furthermore relates to a light-converting mixture, to a light source and to a lighting unit which contains the light-converting material according to the invention. The present invention furthermore relates to a process for the production of a light source containing the light-converting material according to the invention.

BACKGROUND OF THE INVENTION

About 20% of energy consumption in Germany is for the generation of light. Conventional incandescent lamps are inefficient, and the most efficient fluorescent lamps contain up to 10 mg of mercury. Solid-state lighting devices, such as, for example, light-emitting diodes (LEDs), are a highly promising alternative, since they have better efficiency in the conversion of electrical energy into light (energy efficiency), a longer lifetime and higher mechanical stability than conventional light sources. LEDs can be used in multifarious applications, including displays, motor vehicle and sign illumination and domestic and street lighting. Depending on the inorganic semiconductor compound used for its production, an LED can emit monochromatic light in various regions of the spectrum. However, "white" light, which is necessary for much of the lighting industry, cannot be generated using a conventional LED. Current solutions for the generation of white light include either the use of three or more LEDs having different colours (for example red, green and blue or "RGB") or the use of a colour conversion layer comprising a conventional phosphor material (for example YAG:Ce) for the generation of white light from ultraviolet (UV) or blue emission of an LED. Thus, blue light is converted into light having a longer wavelength, and the combination of blue and yellow light is perceived as white light by the human eye. However, white light of this type is virtually never ideal and has in many cases undesired or unpleasant properties, which may require improvement or correction. The simpler construction of conversion LEDs is directed to the mass market of lighting devices. At present, these LED lamps are still significantly more expensive than conventional incandescent lamps and most fluorescent lamps, and the commercially available white LEDs emit a bluish, cold-white light having poor colour reproduction properties. This quality of white light which is perceived as poor originates from the yellow conversion phosphor material YAG:Ce owing to the lack of emission in the green and red parts of the spectrum.

For displays, it is important to have three or more primary colours having a narrow spectral full width at half maximum (FWHM), which are obtained with LEDs (typical FWHM<30 nm). This enables a large gamut to be covered. "Gamut" is normally defined as the range of colour types which is obtainable by mixing three colours. However, the solution of using three or more LEDs of different colours is too expensive and complex for many applications. It is therefore desirable to have available a light source which enables large gamut coverage using a single LED, which can be achieved by conversion materials which emit in a narrow band. A process for the provision of LEDs for a light source having a broad spectrum utilises phosphors which convert the short-wave LED light into light having a longer wavelength. For example, a phosphor which emits light over a broad range of green wavelengths can be excited using blue light from an LED which generates a narrow blue spectrum. The green light generated by the phosphor is then used as a component of the white light source. By combining a plurality of phosphors, a white light source having a broad spectrum can in principle be created, provided that the efficiencies of the phosphors during the light conversion are sufficiently high. This would result in improved colour reproduction properties. Further details can be found in "*Status and prospects for phosphor-based white LED Packaging*", Z. Liu et al., Xiaobing Front. Optoelectron. China 2009, 2(2): 119-140.

Unfortunately, however, a light designer does not have access to any desired set of phosphors from which he is able to select. There is only a limited number of conventional rare-earth element-containing phosphors which can be employed in LEDs and which have adequate efficiencies in light conversion. The emission spectrum of these phosphors cannot readily be modified. In addition, the spectra are less than ideal inasmuch as the light emitted as a function of the wavelength is not constant. Even combination of a plurality of phosphors therefore does not produce an optimum white light source. In addition, red phosphors currently used emit light deep into the long-wave red spectral region, which additionally reduces the brightness of such LEDs and thus their efficiency.

U.S. Pat. Nos. 7,102,152, 7,495,383 and 7,318,651 disclose devices and processes for the emission of light in which both semiconductor nanoparticles in the form of quantum dots (QDs) and also non-quantum fluorescent materials are utilised in order to convert at least some of the light originally emitted by a light source of the device into light having a longer wavelength. QDs have a high quantum yield and a narrow emission spectrum with a central emission wavelength which can be adjusted via the size. A combination of both QDs and phosphors enables the light quality to be improved. QD additions enable improvements to be achieved, but have the disadvantage of high inherent absorption, i.e. they absorb light which is emitted when they are excited themselves. This reduces the overall energy efficiency of the light conversion. In addition, QDs, like commercially available red emitters, likewise reabsorb the green phosphor emission, which additionally results in a decrease in the energy efficiency and in addition in a shift in the emission spectrum, making targeted colour planning more difficult. In addition, separation may occur during production of LEDs when QD materials and phosphors are used, meaning that a homogeneous distribution of the light-converting materials is no longer ensured. Reduced energy efficiency and inadequate control of the desired colour reproduction are the consequence.

In some applications, clusters with tightly packed QDs are desired. Tightly packed QD clusters of this type exhibit a phenomenon which is known under the name fluorescence resonance energy transfer (FRET), see, for example, Joseph R. Lakowicz, "Principles of Fluorescence Spectroscopy", 2nd Edition, Kluwer Academic/Plenum Publishers, New York, 1999, pp. 367-443. FRET occurs between a donor QD, which emits with a shorter (for example bluer) wavelength, and an acceptor QD, which is arranged in the direct vicinity and emits with longer wavelength. A dipole-dipole interaction occurs between the dipole moment of the donor emission transition and the dipole moment of the acceptor absorption transition. The efficiency of the FRET process depends on the spectral overlap between the absorption of the donor and the emission of the acceptor. The FRET separation between quantum dots is typically 10 nm or less. The efficiency of the FRET effect is very highly dependent on the separation. FRET results in a colour change (red shift) and in efficiency losses during light conversion. For this reason, efforts were made in earlier work to avoid cluster formation of QDs in light-converting materials.

Semiconductor nanoparticles are a class of nanomaterials whose physical properties can be adjusted over a broad range by adjustment of the particle size, composition and shape. In particular, the fluorescence emission is one of the properties of this class which is dependent on the particle size. The adjustability of the fluorescence emission is based on the quantum limitation effect, according to which a reduction in the particle size results in "particle in a box" behaviour, which results in a blue shift of the band gap energy and thus in light emission. Thus, for example, the emission of CdSe nanoparticles can be adjusted from 660 nm for particles having a diameter of ~6.5 nm to 500 nm for particles having a diameter of ~2 nm. Similar behaviour can be achieved for other semiconductor nanoparticles, which results in it being possible to cover a broad spectral range from the ultraviolet (UV) region (on use of, for example, ZnSe or CdS) via the visible (VIS) region (on use of, for example, CdSe or InP) to the near infrared (NIR) region (on use of, for example, InAs). A change in the shape of the nanoparticles has already been demonstrated for a number of semiconductor systems, where, in particular, the rod shape is of importance. Nanorods have properties which differ from the properties of spherical nanoparticles. For example, they exhibit emission which is polarised along the longitudinal axis of the rod, whereas spherical nanoparticles have unpolarised emission. Anisotropic (elongate) nanoparticles, such as nanorods (also sometimes referred to as "rods" below), are thus suitable for polarised emission (see WO 2010/095140 A3). X. Peng et al. in "Shape control of CdSe nanocrystals" in *Nature,* 2000, 404, 59-61, describe CdSe nanorods which are embedded in a polymer and which are based on a colloid-based semiconductor core (without shell). Virtually complete polarisation emanates from individual nanorods here. T. Mokari and U. Banin in "Synthesis and properties of CdSe/ZnS rod/shell nanocrystals" in *Chemistry of Materials* 2003, 15 (20), 3955-3960, describe an improvement in the emission of nanorods if a shell is applied to the rod structure. D. V. Talapin et al. in "Seeded Growth of Highly Luminescent CdSe/CdS Nanoheterostructures with Rod and Tetrapod Morphologies" in *Nano Letters* 2007, 7 (10), 2951-2959, describe an improvement in the quantum yield achieved for nanorod particles having a covering (shell). C. Carbone et al. in "Synthesis and Micrometer-Scale Assembly of Colloidal CdSe/CdS Nanorods Prepared by a Seeled Growth Approach" in *Nano Letters* 2007, 7 (10), 2942-2950, describe a dipole emission pattern for nanorods having a shell, which means that the emission emanates from the centre of the rod instead of from its tips. In addition, it has been shown that nanorods have advantageous properties with respect to optical amplification, which illustrates their potential for use as laser materials (Banin et al., *Adv. Mater.,* 2002, 14, 317). For individual nanorods, it has likewise been shown that they exhibit unique behaviour in external electrical fields, since the emission can be switched on and off reversibly (Banin et al., *Nano Letters,* 2005, 5, 1581). A further attractive property of colloidal semiconductor nanoparticles is their chemical accessibility, which allows these materials to be processed in various ways. The semiconductor nanoparticles can be applied in the form of thin layers from solution by spin coating or spray coating or embedded in plastics. Jan Ziegler et al. in "Silica-Coated In P/ZnS Nanocrystals as Converter Material in White LEDs", Advanced Materials, Vol. 20, No. 21, 13 Oct. 2008, pages 4068-4073, describe the production of white LEDs with the addition of a silicone composite layer which comprises a light-emitting conversion material on a high-performance blue LED chip.

The use of semiconductor nanoparticles in LED applications has been described, inter alia, in US 2015/0014728 A1, which relates to a phosphor/matrix composite powder which can be used in an LED. The phosphor/matrix composite powder comprises a matrix and a plurality of phosphors or quantum dots having a size of 100 nm or less which are dispersed in the matrix, where the size of the composite powder is 20 μm or more and it has a certain surface roughness. Even during its production, the composite powder described requires precise setting of the mixing ratios of the phosphors and quantum dots in order to achieve the desired emission behaviour. By contrast, subsequent adaptation of the mixing ratios is not possible, which results in restricted flexibility in the usability of the composite powder in the production of LEDs. In addition, the efficiency of the energy conversion is highly dependent on the type and amount of the phosphor materials dispersed in the matrix. In particular if the amount of the phosphors and/or quantum dots is large, it becomes difficult to sinter the material. In addition, the porosity increases, which makes efficient irradiation with excitation light more difficult and impairs the mechanical strength of the material. If, however, the amount of the phosphor materials dispersed in the matrix is too low, it becomes difficult to achieve adequate light conversion.

In view of the numerous deficiencies of the known light-conversion materials mentioned above, including the known combinations of QDs with conventional phosphors (conversion phosphors), there is a need for semiconductor nanoparticle materials and compositions which comprise such materials with conventional phosphors which do not have such deficiencies. In particular, there is a need for combinations of semiconductor nanoparticles and conversion phosphors having low to negligible reabsorption and having low inherent absorption, which results in high efficiency in the conversion of light and in improved controllability of the gamut.

It would therefore be desirable to have available light-converting materials based on semiconductor nanoparticles which are distinguished by low reabsorption and inherent absorption and thus increase the energy efficiency of an LED. Furthermore, it would be desirable to have available light-converting materials based on semiconductor nanoparticles which are distinguished by improved miscibility with conventional phosphors, so that the disadvantages described above (for example reduced energy efficiency and inadequate control of colour reproduction) which arise owing to separation effects during LED production are avoided.

OBJECT OF THE INVENTION

The object of the present invention is therefore to provide a light-converting material based on semiconductor nanoparticles which does not have the above-described disadvantages from the prior art. In particular, it is an object of the present invention to provide a light-converting material based on semiconductor nanoparticles which has improved miscibility with conventional phosphors and consequently facilitates more efficient production of LEDs, since losses owing to separation effects during mixing are avoided. A further object of the present invention is the provision of a light-converting material based on semiconductor nanoparticles which exhibits low reabsorption in the green spectral region and thus, owing to reduced double conversion, enables increased efficiency of the LEDs and improved predictability of the LED spectrum. It is furthermore an object of the present invention to provide a light-converting material based on semiconductor nanoparticles which is distinguished by ready processability during the production of LEDs and enables LED manufacturers to use existing equipment and machines for the production of LEDs. In addition, it is an aim of the present invention to provide a light-converting material based on semiconductor nanoparticles which enables improved and more targeted setting of the LED emission compared with conventional semiconductor nanoparticles which are in the form of films or are present on activated phosphors, which allows more flexible use. A further object of the present invention is the provision of a light-converting material based on semiconductor nanoparticles which enables increased brightness of the LEDs and in addition is distinguished by narrow-band emission, meaning that energy losses in the long-wave spectral region are avoided and improved gamut coverage in displays is facilitated. A further object is for it to be possible to coat the light-converting material according to the invention using existing coating methods which are used in the production of phosphors, where an additional barrier layer of this type is unnecessary.

DESCRIPTION OF THE INVENTION

Surprisingly, it has been found that the objects described above are achieved if semiconductor nanoparticles are applied to the surface of an unactivated crystalline material in order to obtain a light-converting material. Furthermore, it has been found, surprisingly, that unactivated crystalline materials with semiconductor nanoparticles on the surface have a similar particle-size and density distribution to conventional phosphors. This results in improved miscibility of light-converting materials of this type with conventional phosphors and enables more efficient production of LEDs, which are distinguished by improved performance data, such as energy efficiency, brightness and stability.

The objects mentioned above are thus achieved by a light-converting material which comprises semiconductor nanoparticles and an unactivated crystalline material, where the semiconductor nanoparticles are located on the surface of the unactivated crystalline material.

Embodiments of the present invention relate to light-converting materials which comprise one or more types of an unactivated crystalline material and one or more types of a semiconductor nanoparticle. The resultant light-converting material can be in the form of loose material, powder material, thick or thin layer material or self-supporting material in the form of a film. It may furthermore be embedded in a casting material. The light-converting material may comprise additive materials, such as, for example, ligands and/or coating materials.

The inventors have surprisingly found that semiconductor nanoparticles have improved physical properties if they are located on the surface of unactivated crystalline materials, which results in them being more suitable for combination with conventional phosphors in lighting applications. In particular, the inventors have established that the use of the light-converting material according to the invention in light sources results in lesser reabsorption effects and self-absorption effects of the semiconductor nanoparticles, which enables controlled colour setting and high efficiency. In addition, the light-converting material according to the invention suppresses fluorescence resonance energy transfer (FRET) and the associated undesired consequences. Semiconductor nanoparticles have very low photoluminescence self-absorption and very low absorption of the emission of conventional phosphors and are therefore, in particular in optically dense layers, more energy efficient than conventional phosphors. A light-converting material of the present invention is thus distinguished by low self-absorption and low reabsorption.

The present invention furthermore provides a light-converting mixture which comprises one or more of the light-converting materials according to the invention.

The light-converting material according to the invention and the light-converting mixture according to the invention enable the partial or complete conversion of ultraviolet and/or blue light into light having a longer wavelength, such as, for example, green or red light.

In addition, the present invention provides a light source which contains at least one primary light source and at least one light-converting material according to the invention or at least one light-converting mixture according to the invention.

The light source of the present invention can be used in a lighting unit.

In addition, the present invention provides a process for the production of the light source according to the invention, where the light-converting material according to the invention or the light-converting mixture according to the invention is applied to the primary light source or a support material in the form of a film by spin coating, spray coating or in the form of a film as laminate.

Preferred embodiments of the invention are described in the dependent claims.

DEFINITIONS

Figure 1:
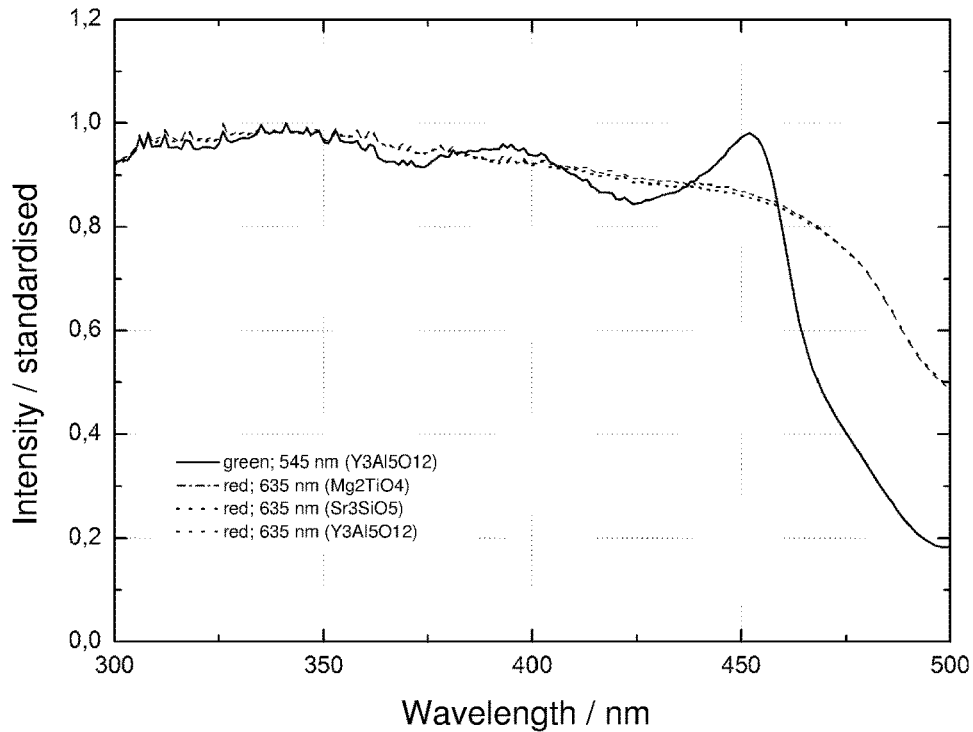
FIG. 1: Absorption spectra of the light-converting materials prepared from Examples 1 to 4.

As used in the present application, the term "light-converting material" denotes a combination of semiconductor nanoparticles with an unactivated crystalline material, where the semiconductor nanoparticles are located on the surface of the unactivated crystalline material. The light-converting material of the present invention may comprise one or more types of semiconductor nanoparticles and/or one or more types of unactivated crystalline materials, where the semiconductor nanoparticles are located on the surface of the unactivated crystalline material or the unactivated crystalline materials.

As used in the present application, the term "unactivated crystalline material" denotes an inorganic material in particle form which is crystalline and does not have an activator, i.e. light-converting centres. The unactivated crystalline material is thus itself neither luminescent nor fluorescent. In addition, it has no specific inherent absorption in the visible region and is consequently colourless. Furthermore, the unactivated crystalline material is transparent. The unactivated crystalline material serves as support material for the semiconductor nanoparticles. Owing to the lack of colour and the transparency of the unactivated crystalline material, light emitted by a primary light source, by another phosphor or another light-converting material is able to pass through the material unhindered and with no losses, which increases the efficiency of the use of the light-converting material according to the invention in an LED.

As used in the present application, the terms "phosphor" or "conversion phosphor", which are used as synonyms here, denote a fluorescent inorganic material in particle form having one or more emitting centres. The emitting centres are formed by activators, usually atoms or ions of a rare-earth metal element, such as, for example, La, Ce, Pr, Nd, Pm, Sm, Eu, Gd, Tb, Dy, Ho, Er, Tm, Yb and Lu, and/or atoms or ions of a transition-metal element, such as, for example, Cr, Mn, Fe, Co, Ni, Cu, Ag, Au and Zn, and/or atoms or ions of a main-group metal element, such as, for example, Na, Tl, Sn, Pb, Sb and Bi. Examples of phosphors or conversion phosphors include garnet-based phosphors, silicate-based, orthosilicate-based, thiogallate-based, sulfide-based and nitride-based phosphors. Phosphor materials in the sense of the present invention have no quantum limitation effects. Non-quantum-limited phosphor materials of this type can be phosphor particles with or without silicon dioxide coating. A phosphor or conversion phosphor in the sense of the present application is taken to mean a material which absorbs radiation in a certain wavelength range of the electromagnetic spectrum, preferably in the blue or UV spectral range, and emits visible light in another wavelength range of the electromagnetic spectrum, preferably in the violet, blue, green, yellow, orange or red spectral range. The term "radiation-induced emission efficiency" should also be understood in this connection, i.e. the conversion phosphor absorbs radiation in a certain wavelength range and emits radiation in another wavelength range with a certain efficiency. The term "shift of the emission wavelength" is taken to mean that a conversion phosphor emits light at a different wavelength compared with another or similar conversion phosphor, i.e. shifted towards a shorter or longer wavelength.

The term "semiconductor nanoparticle" (quantum material) in the present application denotes a nanoparticle which consists of a semiconductor material. Semiconductor nanoparticles are any desired discrete units having at least one dimension in the sub-micron size, which, in some embodiments, is less than 100 nm and in some other embodiments has a size of less than one micron as the largest dimension (length). In some other embodiments, the dimension is less than 400 nm. The semiconductor nanoparticle can have any desired symmetrical or asymmetrical geometrical shape, and non-restrictive examples of possible shapes are elongate, round, elliptical, pyramidal, etc. A specific example of a semiconductor nanoparticle is an elongate nanoparticle, which is also called a nanorod and is made from a semiconducting material. Further semiconductor nanorods which can be used are those having a metal or metal-alloy region on one or both ends of the respective nanorod. Examples of such elongate semiconductor/metal nanoparticles and the production thereof are described in WO 2005/075339, the disclosure content of which is incorporated herein by way of reference. Other possible semiconductor/metal nanoparticles are shown in WO 2006134599, the disclosure content of which is incorporated herein by way of reference.

Furthermore, semiconductor nanoparticles in a core/shell configuration or a core/multishell configuration are known. These are discrete semiconductor nanoparticles which are characterised by a heterostructure, in which a "core" comprising one type of material is covered with a "shell" comprising another material. In some cases, the shell is allowed to grow on the core, which serves as "seed core". The core/shell nanoparticles are then also referred to as "seeded" nanoparticles. The expression "seed core" or "core" relates to the innermost semiconductor material present in the heterostructure. Known semiconductor nanoparticles in core/shell configuration are shown, for example, in EP 2 528 989 B1, the contents of which are incorporated into the present description in their totality by way of reference. Thus, for example, punctiform semiconductor nanoparticles are known, in which a spherical shell is arranged symmetrically around a spherical core (so-called quantum dots in quantum dots). In addition, rod-shaped semiconductor nanoparticles are known, in which a spherical core is arranged asymmetrically in an elongate rod-shaped shell (so-called quantum dots in quantum rods). The expression nanorod denotes a nanocrystal having a rod-like shape, i.e. a nanocrystal which is formed by increased growth along a first ("longitudinal") axis of the crystal, while the dimensions along the other two axes are kept very small. A nanorod has a very small diameter (typically less than 10 nm) and a length which can be in the range from about 6 nm to about 500 nm. The core typically has a virtually spherical shape. However, cores having different shapes, such as, for example, pseudopyramids, cube octahedra, rods and others, can also be used. Typical core diameters are in the range from about 1 nm to about 20 nm. In the case of symmetrical punctiform semiconductor nanoparticles in core/shell configuration (quantum dots in quantum dots), the total particle diameter $d_2$ is usually much greater than the core diameter $d_1$. The magnitude of $d_2$ compared with $d_1$ influences the optical absorption of the symmetrical punctiform semiconductor nanoparticle in core/shell configuration. As is known, a semiconductor nanoparticle in core/shell configuration may comprise further outer shells, which may provide better optical and chemical properties, such as a higher quantum yield (QY) and better durability. The semiconductor nanoparticle then has a core/multishell configuration. In the case of a rod-shaped semiconductor nanoparticle in core/multishell configuration, the length of the first shell can generally be in the range between 10 nm and 200 nm and in particular between 15 nm and 160 nm. The thicknesses of the first shell in the other two dimensions (radial axis of the rod shape) can be in the range between 1 nm and 10 nm. The thickness of the further shells can generally be in the range between 0.3 nm and 20 nm and in particular between 0.5 nm and 10 nm.

Other embodiments are, for example, nanotetrapods (as described in U.S. Pat. No. 8,062,421 B2), which comprise a core consisting of a first material and at least one arm, but typically four further arms, consisting of a second material, where the core and the arms differ in their crystal structure. Nanotetrapods of this type have a large Stokes shift.

The term "core material" denotes the material that forms the core of semiconductor nanoparticles in a core/shell configuration or core/multishell configuration. The material can be a semiconductor from groups II-VI, III-V, IV-VI or I-III-VI$_2$ or any desired combination of one or more thereof. For example, the core material can be selected from the group consisting of CdS, CdSe, CdTe, ZnS, ZnSe, ZnTe, ZnO, GaAs, GaP, GaAs, GaSb, GaN, HgS, HgSe, HgTe, InAs, InP, InSb, AlAs, AlP, AlSb, Cu$_2$S, Cu$_2$Se, CuGaS$_2$, CuGaSe$_2$, CuInS$_2$, CuInSe$_2$, Cu$_2$(InGa)S$_4$, AgInS$_2$, AgInSe$_2$, Cu$_2$(ZnSn)S$_4$, alloys thereof and mixtures thereof.

The term "shell material" relates to the semiconductor material from which the shell of a semiconductor nanoparticle having a core/shell configuration or each of the individual shells of a semiconductor nanoparticle having a core/multishell configuration is built up. The material can be a semiconductor from groups II-VI, III-V, IV-VI or I-III-VI$_2$ or any desired combination of one or more thereof. For example, the shell material can be selected from the group consisting of CdS, CdSe, CdTe, ZnS, ZnSe, ZnTe, ZnO, GaAs, GaP, GaAs, GaSb, GaN, HgS, HgSe, HgTe, InAs, InP, InSb, AlAs, AlP, AlSb, Cu$_2$S, Cu$_2$Se, CuGaS$_2$, CuGaSe$_2$, CuInS$_2$, CuInSe$_2$, Cu$_2$(InGa)S$_4$, AgInS$_2$, AgInSe$_2$, Cu$_2$(ZnSn)S$_4$, alloys thereof and mixtures thereof.

The term "ligand" relates to an outer surface coating of the semiconductor nanoparticles which results in a passivation effect and serves to prevent agglomeration or aggregation of the nanoparticles by overcoming the Vander-Waals forces. Ligands which can generally be used are: phosphines and phosphine oxides, such as trioctylphosphine oxide (TOPO), trioctylphosphine (TOP) or tributylphosphine (TBP); phosphonic acids, such as dodecylphosphonic acid (DDPA), tridecylphosphonic acid (TBPA), octadecylphosphonic acid (ODPA) or hexylphosphonic acid (HPA); amines, such as dodecylamine (DDA), tetradecylamine (TDA), hexadecylamine (HDA) or octadecylamine (ODA); imines, such as polyethyleneimine (PEI); thiols, such as hexadecanethiol or hexanethiol; mercaptocarboxylic acids, such as mercaptopropionic acid or mercaptoundecanoic acid; and other acids, such as myristic acid, palmitic acid or oleic acid.

The term "coating material" denotes a material which forms a coating on the surface of the particles of the light-converting material. The term "coating" is used here in order to describe one or more layers of a material which is provided on another material and partly or completely covers the outer surface or the solvent-accessible surface of the other material. From the wording used, it goes without saying that the coating applied to each individual primary particle of the light-converting material results in the production of a multiplicity of different coated primary particles which are separate from one another, instead of a multiplicity of particles which are present or included together in the same coating material in the form of a uniform matrix. The primary particles of the light-converting material typically contain a plurality of semiconductor nanoparticles. The material of the coating (coating material) may penetrate at least partially into the inner structure of the material which has been coated, so long as the coating as barrier still provides adequate protection against external physical influences or the passage of possibly harmful substances, such as, for example, oxygen, moisture and/or free radicals. This increases the stability of the light-converting material, which results in improved durability and lifetime. In addition, the coating material in some embodiments provides the light-converting material with additional functionality, such as, for example, reduced sensitivity to heat, reduced light refraction or improved adhesion of the light-converting materials in polymers or casting materials. Furthermore, unevenness on the surface of the particles of the light-converting material can be smoothed by the application of one or more coating materials. Surface smoothing of this type enables good processability of the light-converting material and reduces undesired optical scattering effects of the emitted light at the surface of the material, which results in increased efficiency.

The term "casting material" relates to a light-transmitting matrix material which includes the light-converting materials according to the invention and the light-converting mixtures according to the invention. The light-transmitting matrix material can be a silicone, a polymer (which is formed from a liquid or semi-solid precursor material, such as a monomer), an epoxide, a glass or a hybrid comprising a silicone and epoxide. Specific, but non-restrictive examples of the polymers include fluorinated polymers, polyacrylamide polymers, polyacrylic acid polymers, polyacrylonitrile polymers, polyaniline polymers, polybenzophenone polymers, poly(methyl methacrylate) polymers, silicone polymers, aluminium polymers, polybispheno polymers, polybutadiene polymers, polydimethylsiloxane polymers, polyethylene polymers, polyisobutylene polymers, polypropylene polymers, polystyrene polymers, polyvinyl polymers, polyvinylbutyral polymers or perfluorocyclobutyl polymers. Silicones may include gels, such as, for example, Dow Corning® OE-6450, elastomers, such as, for example, Dow Corning® OE-6520, Dow Corning® IE-6550, Dow Corning® OE-6630, and resins, such as, for example, Dow Corning® 0E-6635, Dow Corning® 0E-6665, Nusil LS-6143 and other products from Nusil, Momentive RTV615, Momentive RTV656 and many other products from other manufacturers. Furthermore, the casting material can be a (poly)silazane, such as, for example, a modified organic polysilazane (MOPS) or a perhydropolysilazane (PHPS). The content of the light-converting material or the light-converting mixture, based on the casting material, is preferably in the range from 3 to 80% by weight.

PREFERRED EMBODIMENTS OF THE INVENTION

The present invention relates to a light-converting material which comprises semiconductor nanoparticles and an unactivated crystalline material, where the semiconductor nanoparticles are located on the surface of the unactivated crystalline material.

The unactivated crystalline material is colourless, which is attributable to the material comprising no activator, i.e. no emitting centres. It follows from this that the unactivated material is colourless and transparent, since it exhibits no specific inherent absorption, luminescence or fluorescence. Consequently, light emitted by a primary light source or by another phosphor is able to pass through the unactivated crystalline material unhindered and without losses and reach the semiconductor nanoparticles on the surface, by which it is absorbed, converted into light having a longer wavelength and then emitted, causing an increase in the efficiency on use of the light-converting material according to the invention in an LED.

In the present invention, the unactivated crystalline material serves as support material for the semiconductor nanoparticles which are located on the surface of the unactivated crystalline material. The semiconductor nanoparticles may be distributed randomly or in a defined arrangement on the surface of the unactivated crystalline material.

The unactivated crystalline material in the present invention is not restricted with respect to the chemical composition. An unactivated crystalline material in the sense of the present invention is any crystalline inorganic compound which is free from emitting centres which arise due to the insertion of activators. Suitable unactivated crystalline materials are, for example, host lattice materials (matrix materials) of inorganic phosphors which have no activators and thus no emitting centres (unactivated matrix materials). Such matrix materials of inorganic phosphors are unactivated in the sense of the present invention, since they do not exhibit specific inherent absorption and are thus colourless. They are therefore suitable as support materials for the semiconductor nanoparticles. Unactivated matrix materials of a very wide variety of phosphors come into consideration for the present invention, such as, for example, matrix materials of metal-oxide phosphors, matrix materials of silicate and halosilicate phosphors, matrix materials of phosphate and halophosphate phosphors, matrix materials of borate and borosilicate phosphors, matrix materials of aluminate, gallate and alumosilicate phosphors, matrix materials of molybdate and tungstate phosphors, matrix materials of sulfate, sulfide, selenide and telluride phosphors, matrix materials of nitride and oxynitride phosphors and matrix materials of SiAlON phosphors. Furthermore, unactivated complex metal-oxygen compounds, unactivated halogen compounds and unactivated oxy compounds which comprise no dopants and have the requisite crystallinity come into consideration.

In a preferred embodiment of the present invention, the unactivated crystalline material is a matrix material of an inorganic phosphor selected from unactivated crystalline metal oxides, unactivated crystalline silicates and halosilicates, unactivated crystalline phosphates and halophosphates, unactivated crystalline borates and borosilicates, unactivated crystalline aluminates, gallates and alumosilicates, unactivated crystalline molybdates and tungstates, unactivated crystalline sulfates, sulfides, selenides and tellurides, unactivated crystalline nitrides and oxynitrides, unactivated crystalline SiAlONs and other unactivated crystalline materials, such as unactivated crystalline complex metal-oxygen compounds, unactivated crystalline halogen compounds and unactivated crystalline oxy compounds, such as preferably oxysulfides or oxychlorides.

Preferred unactivated crystalline complex metal-oxygen compounds are unactivated arsenates, unactivated germanates, unactivated halogermanates, unactivated indates, unactivated lanthanates, unactivated niobates, unactivated scandates, unactivated stannates, unactivated tantalates, unactivated titanates, unactivated vanadates, unactivated halovanadates, unactivated phosphovanadates, unactivated yttrates and unactivated zirconates.

In a more preferred embodiment of the present invention, the unactivated crystalline material is an unactivated crystalline aluminate, an unactivated crystalline silicate or halosilicate or an unactivated crystalline titanate.

Examples of unactivated crystalline metal oxides include: $M^{2+}O$, $M^{3+}_2O_3$ and $M^{4+}O_2$, in which $M^{2+}$ is Zn, Fe, Co, Ni, Cd, Cu and/or one or more alkaline-earth metals, preferably Be, Mg, Ca, Sr and/or Ba; $M^{3+}$ is Al, Ga, Sc, Y, La and/or one or more rare-earth metals selected from Sc, Y, La, Ce, Pr, Nd, Pm, Sm, Eu, Gd, Tb, Dy, Ho, Er, Tm, Yb and Lu; and $M^{4+}$ is Ti, Zr, Ge, Sn and/or Th.

Preferred examples of unactivated crystalline metal oxides are: $Al_2O_3$, $CaO$, $Ga_2O_3$, $La_2O_3$, $ThO_2$, $Y_2O_3$, $ZnO$, $(Y,Gd)_2O_3$ and $(Zn,Cd)O$.

Examples of unactivated crystalline silicates or halosilicates include: $M^{2+}SiO_3$, $M^{2+}_2SiO_4$, $M^{2+}_2(Si,Ge)O_4$, $M^{2+}_3SiO_5$, $M^{3+}_2SiO_5$, $M^{3+}M^+SiO_4$, $M^{2+}Si_2O_5$, $M^{2+}_2Si_2O_6$, $M^{2+}_3Si_2O_7$, $M^{2+}_2M^+_2Si_2O_7$, $M^{3+}_2Si_2O_7$, $M^{2+}_4Si_2O_8$, $M^{2+}_2Si_3O_8$, $M^{2+}_3M^{3+}_2Si_3O_{12}$, $M^+M^{3+}M^{2+}_4Si_4O_{10}$, $M^+M^{2+}_4M^{3+}Si_4O_{14}$, $M^{2+}_3M^{3+}_2Si_6O_{18}$, $M^{3+}SiO_3X$, $M^{2+}_3SiO_4X_2$, $M^{2+}_5SiO_4X_6$, $M^+_2M^{2+}_2Si_4O_{10}X_2$, $M^{2+}_5Si_4O_{10}X_6$, $M^+_2SiX_6$, $M^{2+}_3SiO_3X_4$ and $M^{2+}_9(SiO_4)_4X_2$, in which $M^+$ is one or more alkali metals, preferably Li, Na and/or K; $M^{2+}$ is Zn, Fe, Co, Ni, Cd, Cu and/or one or more alkaline-earth metals, preferably Be, Mg, Ca, Sr and/or Ba; $M^{3+}$ is Al, Sc, Y, La and/or one or more rare-earth metals selected from Sc, Y, La, Ce, Pr, Nd, Pm, Sm, Eu, Gd, Tb, Dy, Ho, Er, Tm, Yb and Lu; and X is one or more halogens, preferably F, Cl, Br and/or I.

Preferred examples of unactivated crystalline silicates and halosilicates are: $Ba_2(Mg,Sr)Si_2O_7$, $Ba_2SiO_4$, $(Ba,Sr)_2SiO_4$, $Ba_5SiO_4Br_6$, $BaSi_2O_5$, $BaSrMgSi_2O_7$, $Be_2SiO_4$, $Ca_2MgSi_2O_7$, $Ca_3MgSi_2O_8$, $Ca_3SiO_4Cl_2$, $CaMgSi_2O_6$, $CaSi_3$, $(Ca,Mg)SiO_3$, $(Ca,Sr)_2SiO_4$, $Gd_2SiO_5$, $K_2SiF_6$, $LaSiO_3Cl$, $LiCeBa_4Si_4O_{14}$, $LiCeSrBa_3Si_4O_{14}$, $LiNa(Mg,Mn)_2Si_4O_{10}F_2$, $Lu_2Si_2O_7$, $Lu_2SiO_5$, $(Lu,Gd)_2SiO_5$, $Mg_2SiO_4$, $Mg_3SiO_3F_4$, $MgBa_3Si_2O_8$, $MgSiO_3$, $MgSr_3Si_2O_8$, $Sr_2MgSi_2O_7$, $Sr_2SiO_4$, $Sr_3Gd_2Si_6O_{18}$, $Sr_5Si_4O_{10}Cl_6$, $SrBaSiO_4$, $SrMgSi_2O_6$, $Y_2Si_2O_7$, $Y_2SiO_5$, $Zn_2(Si,Ge)O_4$, $Zn_2SiO_4$ and $(Zn,Be)_2SiO_4$.

Examples of unactivated crystalline phosphates or halophosphates include: $M^{3+}PO_4$, $M^{2+}P_2O_6$, $M^{2+}_2P_2O_7$, $M^+_2M^{2+}P_2O_7$, $M^{4+}P_2O_7$, $M^{2+}B_2P_2O_9$, $M^{2+}_6BP_5O_{20}$, $M^{2+}_3(PO_4)_2$, $M^+_3M^{3+}(PO_4)_2$, $M^{2+}_6(PO_4)_4$ and $M^{2+}_5(PO_4)_3X$, in which $M^+$ is one or more alkali metals, preferably Li, Na and/or K; $M^{2+}$ is Zn, Fe, Co, Ni, Cd, Cu and/or one or more alkaline-earth metals, preferably Be, Mg, Ca, Sr and/or Ba; $M^{3+}$ is Al, Sc, Y, La and/or one or more rare-earth metals selected from Sc, Y, La, Ce, Pr, Nd, Pm, Sm, Eu, Gd, Tb, Dy, Ho, Er, Tm, Yb and Lu; $M^{4+}$ is Ti, Zr, Ge and/or Sn; and X is one or more halogens, preferably F, Cl, Br and/or I.

Preferred examples of unactivated crystalline phosphates and halophosphates are: $Ba_3(PO_4)_2$, $Ca_2Ba_3(PO_4)_3Cl$, $Ca_2P_2O_7$, $Ca_3(PO_4)_2$, $(Ca,Sr)_3(PO_4)_2$, $(Ca,Zn,Mg)_3(PO_4)_2$, $Ca_5(PO_4)_3(F,Cl)$, $Ca_5(PO_4)_3Cl$, $Ca_5(PO_4)_3F$, $CaB_2P_2O_9$, $CaP_2O_6$, $CaSr_2(PO_4)_2$, $LaPO_4$, $(La,Ce,Tb)PO_4$, $Li_2CaP_2O_7$, $LuPO_4$, $Mg_3Ca_3(PO_4)_4$, $MgBa_2(PO_4)_2$, $MgBaP_2O_7$, $MgCaP_2O_7$, $MgSr_5(PO_4)_4$, $MgSrP_2O_7$, $Na_3Ce(PO_4)_2$, $Sr_2P_2O_7$, $Sr_3(PO_4)_2$, $Sr_5(PO_4)_3Cl$, $Sr_5(PO_4)_3F$, $Sr_6BP_5O_{20}$, $YPO_4$, $Zn_3(PO_4)_2$, $Zn_3(PO_4)_2$, $ZnMg_2(PO_4)_2$, and $(Zn,Mg)_3(PO_4)_2$.

Examples of unactivated crystalline borates, haloborates or borosilicates include: $M^{3+}BO_3$, $M^{2+}B_2O_4$, $M^{2+}_2B_2O_5$, $M^{3+}_2B_2O_6$, $M^{3+}_2B_3O_6$, $M^{2+}B_6O_{10}$, $M^{2+}M^{3+}BO_4$, $M^{2+}M^{3+}B_3O_7$, $M^{2+}B_4O_7$, $M^{2+}_3M^{3+}_2B_4O_{12}$, $M^{3+}_4B_4O_{12}$, $M^{3+}M^{2+}B_5O_{10}$, $M^{2+}_2B_6O_{11}$, $M^{2+}B_8O_{13}$, $M^{2+}_2B_5O_9X$, $M^{2+}_2M^{3+}_2BO_{6.5}$, $M^{2+}_5B_2SiO_{10}$, in which $M^{2+}$ is Zn, Fe, Co, Ni, Cd, Cu and/or one or more alkaline-earth metals, preferably Be, Mg, Ca, Sr and/or Ba; $M^{3+}$ is Al, Ga, In, Sc, Y, La and/or one or more rare-earth metals selected from Sc, Y, La, Ce, Pr, Nd, Pm, Sm, Eu, Gd, Tb, Dy, Ho, Er, Tm, Yb and Lu; and X is one or more halogens, preferably F, Cl, Br and/or I.

Preferred examples of unactivated crystalline borates and borosilicates are: $Ca_2B_2O_5$, $Ca_2B_5O_9Br$, $Ca_2B_5O_9Cl$, $Ca_2La_2BO_{6.5}$, $Ca_5B_2SiO_{10}$, $CaB_2O_4$, $CaLaB_3O_7$, $CaLaBO_4$, $CaYBO_4$, $Cd_2B_6O_{11}$, $GdMgB_5O_{10}$, $InBO_3$, $LaAl_3B_4O_{12}$, $LaAlB_2O_6$, $LaB_3O_6$, $LaBO_3$, $MgB_2O_4$, $MgYBO_4$, $ScBO_3$, $Sr_2B_5O_9Cl$, $SrB_4O_7$, $SrB_8O_{13}$, $YAl_3B_4O_{12}$, $YBO_3$, $(Y,Gd)BO_3$ and $ZnB_2O_4, SrO \cdot 3B_2O_3$.

Examples of unactivated crystalline aluminates, gallates or alumosilicates include: $M^+AlO_2$, $M^{3+}AlO_3$, $M^{2+}M^{3+}AlO_4$, $M^{2+}Al_2O_4$, $M^{2+}Al_4O_7$, $M^+Al_5O_8$, $M^{3+}{}_4Al_2O_9$, $M^{3+}{}_3Al_5O_{12}$, $M^+Al_{11}O_{17}$, $M^{2+}{}_2Al_{10}O_{17}$, $M^{3+}{}_3Al_5O_{12}$, $M^{3+}{}_3(Al,Ga)_5O_{12}$, $M^{3+}{}_3Sc_2Al_3O_{12}$, $M^{2+}{}_2Al_6O_{11}$, $M^{2+}Al_8O_{13}$, $M^{2+}M^{3+}Al_{11}O_{19}$, $M^{2+}Al_{12}O_{19}$, $M^{2+}{}_4Al_{14}O_{25}$, $M^{2+}{}_3Al_{16}O_{27}$, $M^{2+}Ga_2O_4$, $M^{2+}Ga_4O_7$, $M^{3+}{}_3Ga_5O_{12}$, $M^+Ga_{11}O_{17}$, $M^{2+}Ga_{12}O_{19}$, $M^+{}_2M^{2+}{}_3Al_2Si_2O_{10}$ and $M^{2+}{}_3Al_2Si_3O_{12}$, in which $M^+$ is one or more alkali metals, preferably Li, Na and/or K; $M^{2+}$ is Zn, Fe, Co, Ni, Cd, Cu and/or one or more alkaline-earth metals, preferably Be, Mg, Ca, Sr and/or Ba; $M^{3+}$ is Al, Sc, Y, La and/or one or more rare-earth metals selected from Sc, Y, La, Ce, Pr, Nd, Pm, Sm, Eu, Gd, Tb, Dy, Ho, Er, Tm, Yb and Lu; and X is one or more halogens, preferably F, Cl, Br and/or I.

Preferred examples of unactivated crystalline aluminates, gallates and alumosilicates are: $BaAl_{12}O_{19}$, $BaAl_8O_{13}$, $BaMgAl_{10}O_{17}$, $CaAl_2O_4$, $CaAl_4O_7$, $(Ca,Ba)Al_{12}O_{19}$, $CaGa_2O_4$, $CaGa_4O_7$, $CeMgAl_{11}O_{19}$, $Gd_3Ga_5O_{12}$, $Gd_3Sc_2Al_3O_{12}$, $GdAlO_3$, $KAl_{11}O_{17}$, $KGa_{11}O_{17}$, $LaAlO_3$, $LaMgAl_{11}O_{19}$, $LiAl_5O_8$, $LiAlO_2$, $LiAlO_2$, $Lu_3Al_5O_{12}$, $LuAlO_3$, $(Lu,Y)AlO_3$, $MgAl_2O_4$, $MgGa_2O_4$, $MgSrAl_{10}O_{17}$, $Sr_2Al_6O_{11}$, $Br_4Al_{14}O_{25}$, $SrAl_{12}O_{19}$, $SrAl_{12}O_4$, $SrAl_4O_7$, $SrGa_{12}O_{19}$, $SrGa_2O_4$, $Tb_3Al_5O_{12}$, $Y_3(Al,Ga)_5O_{12}$, $(Y,Gd)_3Al_5O_{12}$, $Y_3Al_5O_{12}$, $Y_4Al_2O_9$, $YAlO_3$, $ZnAl_2O_4$ and $ZnGa_2O_4$.

Examples of unactivated crystalline molybdates or tungstates include: $M^{2+}MoO_4$, $M^+M^{3+}Mo_2O_8$, $M^{2+}WO_4$, $M^{2+}{}_3WO_6$, $M^{3+}{}_2W_3O_{12}$, $M^+M^{3+}W_2O_8$, in which $M^+$ is one or more alkali metals, preferably Li, Na and/or K; $M^{2+}$ is Zn, Fe, Co, Ni, Cd, Cu and/or one or more alkaline-earth metals, preferably Be, Mg, Ca, Sr and/or Ba; $M^{3+}$ is Al, Sc, Y, La and/or one or more rare-earth metals selected from Sc, Y, La, Ce, Pr, Nd, Pm, Sm, Eu, Gd, Tb, Dy, Ho, Er, Tm, Yb and Lu; and X is one or more halogens, preferably F, Cl, Br and/or I.

Preferred examples of unactivated crystalline molybdates and tungstates are: $Ba_3WO_6$, $Ca_3WO_6$, $CaMoO_4$, $CaWO_4$, $CaWO_4$, $La_2W_3O_{12}$, $LiEuMo_2O_8$, $MgWO_4$, $Sr_3WO_6$, $SrMoO_4$, $Y_2W_3O_{12}$ and $ZnWO_4$.

Examples of unactivated crystalline complex metal-oxygen compounds include: $M^{3+}AsO_4$, $M^{2+}{}_{13}As_2O_{18}$, $M^{2+}GeO_3$, $M^{2+}{}_2GeO_4$, $M^{2+}{}_4GeO_6$, $M^{2+}{}_4(Ge,Sn)O_6$, $M^{2+}{}_2Ge_2O_6$, $M^{3+}{}_4Ge_3O_{12}$, $M^{2+}{}_5GeO_4X_6$, $M^{2+}{}_8Ge_2O_{11}X_2$, $M^+InO_2$, $M^{2+}In_2O_4$, $M^+LaO_2$, $M^{2+}La_4O_7$, $M^{3+}NbO_4$, $M^{2+}Sc_2O_4$, $M^{2+}{}_2SnO_4$, $M^{3+}TaO_4$, $M^{2+}TiO_3$, $M^{2+}{}_2TiO_4$, $M^+{}_2M^{3+}{}_2Ti_3O_{10}$, $M^{2+}{}_5(VO_4)_3X$, $M^{3+}VO_4$, $M^{3+}(V,P)O_4$, $M^+YO_2$, $M^{2+}ZrO_3$, $M^{2+}{}_2ZrO_4$ and $M^{2+}M^{3+}{}_2ZrO_6$, in which $M^+$ is one or more alkali metals, preferably Li, Na and/or K; $M^{2+}$ is Zn, Fe, Co, Ni, Cd, Cu and/or one or more alkaline-earth metals, preferably Be, Mg, Ca, Sr and/or Ba; $M^{3+}$ is Al, Sc, Y, La, Bi and/or one or more rare-earth metals selected from Sc, Y, La, Ce, Pr, Nd, Pm, Sm, Eu, Gd, Tb, Dy, Ho, Er, Tm, Yb and Lu; $M^{4+}$ is Ti, Zr, Ge and/or Sn; and X is one or more halogens, preferably F, Cl, Br and/or I.

Preferred examples of unactivated crystalline complex metal-oxygen compounds are: $Ba_5GeO_4Br_6$, $Bi_4Ge_3O_{12}$, $Ca_5(VO_4)_3Cl$, $CaGeO_3$, $CaLa_4O_7$, $CaSc_2O_4$, $CaTiO_3$, $CaY_2ZrO_6$, $GdNbO_4$, $GdTaO_4$, $K_2La_2Ti_3O_{10}$, $LaAsO_4$, $LaVO_4$, $LiInO_2$, $LiLaO_2$, $LuTaO_4$, $Mg_{13}As_2O_{18}$, $Mg_2SnO_4$, $Mg_2TiO_4$, $Mg_4(Ge,Sn)O_6$, $Mg_4GeO_6$, $Mg_8Ge_2O_{11}F_2$, $NaYO_2$, $SrTiO_3$, $Y(V,P)O_4$, $YAsO_4$, $YTaO_4$, $YVO_4$ and $Zn_2GeO_4$.

Examples of unactivated crystalline sulfates, sulfides, selenides or tellurides include: $M^{2+}SO_4$, $M^{2+}{}_2(SO_4)_2$, $M^{3+}{}_2(SO_4)_3$, $M^{3+}{}_2(SO_4)_3$, $M^{2+}S$, $M^{2+}(S,Te)$, $M^{2+}Se$, $M^{2+}Te$, $M^{2+}Ga_2S_4$, $M^{2+}Ba_2S_3$ and $M^{2+}Al_2S_4$, in which $M^{2+}$ is Zn, Fe, Co, Ni, Cd, Cu and/or one or more alkaline-earth metals, preferably Be, Mg, Ca, Sr and/or Ba; and $M^{3+}$ is Al, Sc, Y, La, and/or one or more rare-earth metals selected from Sc, Y, La, Ce, Pr, Nd, Pm, Sm, Eu, Gd, Tb, Dy, Ho, Er, Tm, Yb and Lu.

Preferred examples of unactivated crystalline sulfates, sulfides, selenides and tellurides are: $CaGa_2S_4$, CaS, $CaSO_4$, CdS, $Mg_2Ca(SO_4)_3$, $Mg_2Sr(SO_4)_3$, $MgBa(SO_4)_2$, MgS, $MgSO_4$, $SrAl_2S_4$, $SrGa_2S_4$, SrS, $SrSO_4$, $Zn(S,Te)$, $ZnBa_2S_3$, $ZnGa_2S_4$, ZnS, $(Zn,Cd)S$ and ZnSe.

Examples of unactivated crystalline halogen or oxy compounds include: $M^+X$, $M^{2+}X_2$, $M^{3+}X_3$, $M^+M^{2+}X_3$, $M^+M^{3+}X_4$, $M^{2+}M^{3+}{}_2X_8$, $M^+M^{3+}{}_3X_{10}$, $M^{3+}OX$, $M^{2+}{}_8M^{4+}{}_2O_{11}X_2$ and $M^{3+}{}_2O_2S$, in which $M^+$ is one or more alkali metals, preferably Li, Na and/or K; $M^{2+}$ is Zn, Fe, Co, Ni, Cd, Cu and/or one or more alkaline-earth metals, preferably Be, Mg, Ca, Sr and/or Ba; $M^{3+}$ is Al, Sc, Y, La, and/or one or more rare-earth metals selected from Sc, Y, La, Ce, Pr, Nd, Pm, Sm, Eu, Gd, Tb, Dy, Ho, Er, Tm, Yb and Lu; and X is one or more halogens, preferably F, Cl, Br and/or I.

Preferred examples of unactivated crystalline halogen compounds are: $BaBr_2$, $BaCl_2$, $BaF_2$, $(Ba,Sr)F_2$, $BaFBr$, $BaFCl$, $BaY_2F_8$, $CaBr_2$ in $SiO_2$, $CaCl_2$ in $SiO_2$, $CaF_2$, $CaI_2$ in $SiO_2$, $CeF_3$, $CsF$, $CsI$, $KMgF_3$, $KY_3F_{10}$, $LaBr_3$, $LaCl_3$, $LaF_3$, $LiAlF_4$, $LiYF_4$, $MgF_2$, NaI, $NaYF_4$, RbBr, $Sr(Cl,Br,I)_2$ in $SiO_2$, $SrCl_2$ in $SiO_2$, $SrF_2$, $YF_3$, $ZnF_2$ and $(Zn,Mg)F_2$.

Preferred examples of unactivated crystalline oxy compounds are oxysulfides and oxychlorides selected from: $Gd_2O_2S$, $La_2O_2S$, LaOBr, LaOCl, LaOF, $Y_2O_2S$, YOBr, YOCl and YOF.

Examples of unactivated crystalline nitrides, oxynitrides or SiAlONs include: $M^{3+}N$, $M^{2+}Si_2O_2N_2$, $M^{2+}{}_2Si_5N_8$, $M^{3+}{}_3Si_6N_{11}$, $M^{2+}AlSiN_3$, α-sialons and β-sialons, in which $M^{2+}$ is Zn, Fe, Co, Ni, Cd, Cu and/or one or more alkaline-earth metals, preferably Be, Mg, Ca, Sr and/or Ba; and $M^{3+}$ is Al, Ga, Sc, Y, La and/or one or more rare-earth metals selected from Sc, Y, La, Ce, Pr, Nd, Pm, Sm, Eu, Gd, Tb, Dy, Ho, Er, Tm, Yb and Lu.

Preferred examples of unactivated crystalline nitrides and oxynitrides are: $Ba_2Si_5N_8$, $Ca_2Si_5N_8$, $CaAlSiN_3$, $(Ca,Sr)AlSiN_3$, GaN, $La_3Si_6N_{11}$, $Sr_2Si_5N_8$ and $(Sr,Ba)Si_2N_2O_2$.

Preferred unactivated crystalline SiAlONs are: α-sialons and β-sialons.

The said examples of unactivated crystalline materials serve merely for illustration and should in no way be regarded as limiting with respect to the extent and scope of protection of the present invention.

Semiconductor nanoparticles which can be used in the light-converting material of the present invention are semiconductor materials in submicron size which are capable of emitting light having a certain wavelength when they are irradiated with optical excitation radiation having another (shorter) wavelength range. Semiconductor nanoparticles are frequently also called quantum materials. The light emitted by quantum materials is distinguished by a very narrow frequency range (monochromatic light).

In a preferred embodiment of the present invention, the semiconductor nanoparticles consist of at least two different semiconductor materials, which are in the form of an alloy or in a core/shell configuration or core/multishell configuration having at least two shells, where the core comprises either a semiconductor material or an alloy of at least two different semiconductor materials and the shell(s) comprise(s) independently a semiconductor material or an alloy of at least two different semiconductor materials, where a concentration gradient may optionally be present within the core and/or the shell(s) and/or between the core and/or the shell(s). In a more preferred embodiment, the semiconductor materials or the alloys of at least two different semiconductor materials in the core and the adjacent shell and/or in adjacent shells are different.

As already described above, the semiconductor nanoparticles which are suitable for the purposes of the present invention are produced from semiconductor materials. Possible material compositions of the semiconductor nanoparticles which are suitable for the present invention are described in WO 2010/095140 A3 and WO 2011/092646 A2, the contents of which are hereby incorporated into the present application by way of reference. The semiconductor materials are preferably selected from group II-VI semiconductors, group III-V semiconductors, group IV-VI semiconductors, group I-III-VI$_2$ semiconductors and from alloys and/or combinations of these semiconductors, where the semiconductor materials may optionally be doped with one or more transition metals, such as, for example, Mn and/or Cu (cf. M. J. Anc, N. L. Pickett et al., ECS Journal of Solid State Science and Technology, 2013, 2(2), R3071-R3082).

Examples of group II-VI semiconductor materials are: CdSe, CdS, CdTe, ZnO, ZnSe, ZnS, ZnTe, HgS, HgSe, HgTe, CdZnSe and any desired combinations thereof.

Examples of group III-V semiconductor materials are: InAs, InP, InN, GaN, InSb, InAsP, InGaAs, GaAs, GaP, GaSb, AlP, AlN, AlAs, AlSb, CdSeTe, ZnCdSe and any desired combinations thereof.

Examples of group IV-VI semiconductor materials are: PbSe, PbTe, PbS, PbSnTe, Tl$_2$SnTe$_5$ and any desired combinations thereof.

Examples of group I-III-VI$_2$ semiconductor materials are: CuGaS$_2$, CuGaSe$_2$, CuInS$_2$, CuInSe$_2$, Cu$_2$(InGa)S$_4$, AgInS$_2$, AgInSe$_2$ and any desired combinations thereof.

The said examples of semiconductor materials for the semiconductor nanoparticles serve merely for illustration and should in no way be regarded as restrictive with respect to the extent and scope of protection of the present invention. The said semiconductor materials can be used either as an alloy or as a core or shell material in a core/shell configuration or in a core/multishell configuration.

The outer and inner shape of the semiconductor nanoparticles is not restricted further. The semiconductor nanoparticles are preferably in the form of nanodots, nanorods, nanoflakes, nanotetrapods, nanodots in nanorods, nanorods in nanorods and/or nanodots in nanoflakes.

The length of the nanorods is preferably between 8 and 500 nm and more preferably between 10 and 160 nm. The total diameter of a nanorod is preferably between 1 and 20 nm and more preferably between 1 and 10 nm. A typical nanorod has a side ratio (length to diameter) of preferably greater than or equal to 2 and more preferably of greater than or equal to 3.

In a more preferred embodiment, the semiconductor nanoparticles have a large Stokes shift and are in the form of large nanodots, nanodots in nanorods, nanorods in nanorods and/or nanotetrapods.

The Stokes shift describes the shift in the wavelength or frequency of light (electromagnetic radiation) between absorption and emission. The Stokes shift is the difference in the energy between incoming and outgoing photons:

$$\Delta E(\text{photon}) = E(\text{in}) - E(\text{out})$$

In the case of substances which fluoresce due to incident light, the light emitted again is generally shifted into a longer-wave range, which is called a red shift (Stokes rule).

Semiconductor nanoparticles having a large Stokes shift in the sense of the present invention are:

(A) Semiconductor nanoparticles whose emission maximum is between 580 and 680 nm and which satisfy the following condition (I):

$$AR_{red1} = \text{absorption}_{455nm}/\text{max. absorption}_{580\text{-}680\ nm} > 3.5{:}1,\ \text{preferably} > 7{:}1, \quad (I)$$

where $AR_{red1}$ denotes the ratio between the absorption at 455 nm (absorption$_{455nm}$) and the maximum absorption in the wavelength range between 580 and 680 nm (max. absorption$_{580\text{-}680\ nm}$).

(B) Semiconductor nanoparticles whose emission maximum is between 580 and 680 nm and which satisfy the following condition (II):

$$AR_{red2} = \text{absorption}_{405nm}/\text{max. absorption}_{580\text{-}680\ nm} > 6{:}1,\ \text{preferably} > 10{:}1, \quad (II)$$

where $AR_{red2}$ denotes the ratio between the absorption at 405 nm (absorption$_{405nm}$) and the maximum absorption in the wavelength range between 580 and 680 nm (max. absorption$_{580\text{-}680\ nm}$).

(C) Semiconductor nanoparticles whose emission maximum is between 510 and 580 nm and which satisfy the following condition (III):

$$AR_{green1} = \text{absorption}_{455nm}/\text{max. absorption}_{510\text{-}580\ nm} > 2.5{:}1,\ \text{preferably} > 6{:}1, \quad (III)$$

where $AR_{green1}$ denotes the ratio between the absorption at 455 nm (absorption$_{455nm}$) and the maximum absorption in the wavelength range between 510 and 580 nm (max. absorption$_{510\text{-}580\ nm}$).

(D) Semiconductor nanoparticles whose emission maximum is between 510 and 580 nm and which satisfy the following condition (IV):

$$AR_{green2} = \text{absorption}_{405nm}/\text{max. absorption}_{510\text{-}580\ nm} > 3.5{:}1,\ \text{preferably} > 7{:}1, \quad (IV)$$

where $AR_{green2}$ denotes the ratio between the absorption at 405 nm (absorption$_{405nm}$) and the maximum absorption in the wavelength range between 510 and 580 nm (max. absorption$_{510\text{-}580\ nm}$).

The wavelength of the emitted light (emission colour) of the semiconductor nanoparticles in response to the excitation radiation can be selected in a suitable manner by adjustment of the shape, size and/or material composition of the nanoparticles. This flexibility with respect to the emission colour enables great variation of the colour of the light-converting material according to the invention. The emission of red light can be achieved, for example, by CdSe nanodots, CdSe nanorods, CdSe nanodots in CdS nanorods, ZnSe nanodots in CdS nanorods, CdSe/ZnS nanorods, InP nanodots, InP nanorods, CdSe/CdS nanorods, ZnSe nanodots in CdS nanorods and ZnSe/CdS nanorods. The emission of green light can be achieved, for example, by CdSe nanodots, CdSe nanorods, CdSe/CdS nanorods and CdSe/ZnS nanorods. The emission of blue light can be achieved, for example, by core/shell nanodots or core/shell nanorods based on ZnSe, ZnS, ZnSe/ZnS and/or CdS. This illustrative assignment between certain semiconductor nanoparticles and certain emission colours is not definitive and is merely intended to serve for illustration. The person skilled in the art is aware that different emission colours within certain material-dependent limits can be achieved by adjustment of the size of the semiconductor nanoparticles.

Further preferred semiconductor nanoparticles are nanorods having a core/shell configuration with materials selected from CdSe/CdS, CdSeS/CdS, ZnSe/CdS, ZnCdSe/

CdS, CdSe/CdZnS, CdTe/CdS, InP/ZnSe, InP/CdS, InP/ZnS and CuInS$_2$/ZnS; and nanorods having a core/multishell configuration selected from CdSe/CdS/ZnS, CdSe/CdZnS/ZnS, ZnSe/CdS/ZnS, InP/ZnSe/ZnS, InP/CdS/ZnS and InP/CdZnS/ZnS.

In a preferred embodiment, the semiconductor nanoparticles are applied to the surface of an unactivated crystalline material, as described above, so that the semiconductor nanoparticles are present in a ratio of 0.1 to 20% by weight, preferably 0.5 to 2% by weight, based on the unactivated crystalline material.

In a preferred embodiment, the surface of the semiconductor nanoparticles is coated with one or more ligands. The ligands are not subject to any particular restriction, so long as they are suitable for the surface coating of semiconductor nanoparticles. Suitable ligands are, for example, phosphines and phosphine oxides, such as trioctylphosphine oxide (TOPO), trioctylphosphine (TOP) or tributylphosphine (TBP); phosphonic acids, such as dodecylphosphonic acid (DDPA), tridecylphosphonic acid (TBPA), octadecylphosphonic acid (ODPA) or hexylphosphonic acid (HPA); amines, such as dodecylamine (DDA), tetradecylamine (TDA), hexadecylamine (HDA) or octadecylamine (ODA); thiols, such as hexadecanethiol or hexanethiol; mercaptocarboxylic acids, such as mercaptopropionic acid or mercaptoundecanoic acid; and other acids, such as myristic acid, palmitic acid or oleic acid. It is not intended that the examples mentioned above are to be regarded as limiting.

It is furthermore preferred that the surface of the light-converting material of the present invention is coated with one or more coating materials. The coating materials are not subject to any particular restriction, so long as they are suitable for coating the surface of the light-converting material. Suitable materials are, for example, those which are also used for the coating of phosphors, such as, for example, inorganic or organic coating materials. The inorganic coating materials can be dielectric insulators, metal oxides (including transparent conductive oxides), metal nitrides or silicon dioxide-based materials (for example glasses). If a metal oxide is used, the metal oxide can be a single metal oxide (i.e. oxide ions combined with a single type of metal ion, such as, for example, Al$_2$O$_3$) or a mixed metal oxide (i.e. oxide ions combined with two or more types of metal ion, such as, for example, SrTiO$_3$, or a doped metal oxide, such as a doped transparent conductive oxide (TCO), such as, for example, Al-doped ZnO, Ga-doped ZnO, etc.). The metal ion or the metal ions of the (mixed) metal oxide can be selected from any suitable group of the Periodic Table, such as, for example, group 2, 13, 14 or 15, or they can be a d metal or a lanthanide metal.

Particular metal oxides include, but are not restricted to: Al$_2$O$_3$, ZnO, HfO$_2$, SiO$_2$, ZrO$_2$ and TiO$_2$, including combinations, alloys and/or doped species thereof; and/or TCOs, such as, for example, Al-doped ZnO, Ga-doped ZnO and In$_2$O$_3$. The inorganic coatings include silicon dioxide in any suitable form. In some embodiments, one or more of the inorganic coating materials is (are) a metal oxide selected from the group consisting of Al$_2$O$_3$, ZnO, TiO$_2$, In$_2$O$_3$ or combinations and/or doped species thereof. In particular embodiments, the metal oxide is a TCO, for example Al-doped ZnO or Ga-doped ZnO.

Particular metal nitrides include, but are not restricted to: AlN, BN, Si$_3$N$_4$, including combinations, alloys and/or doped species thereof.

It is also possible alternatively and/or additionally to apply an organic coating to the above-mentioned inorganic coating. The organic coating can likewise have an advantageous effect on the stability and durability of the light-converting materials and the dispersibility. Suitable organic materials are (poly)silazanes, such as preferably modified organic polysilazanes (MOPS) or perhydropolysilazanes (PHPS), and mixtures thereof, organic silanes and also other organic materials up to polymers.

The prior art discloses numerous processes for the application of coating materials to light-converting materials or phosphors. Thus, for example, WO 2014/140936, the contents of which are hereby incorporated into the present application by way of reference, describes processes such as, for example, chemical gas-phase deposition (CVD), physical gas-phase deposition (PVD) (including magnetron sputtering), Vitex technology, atom layer deposition (ALD) and molecular layer deposition (MLD). Furthermore, the coating can be carried out by a fluidised-bed process. Further coating processes are described in JP 04-304290, WO 91/10715, WO 99/27033, US 2007/0298250, WO 2009/065480 and WO 2010/075908, the contents of which are hereby incorporated by way of reference.

In order to build up a multilayered coating, different coating materials can be applied successively. Numerous coating materials, such as, for example, metal oxides, such as, for example, Al$_2$O$_3$, SiO$_2$, ZnO, TiO$_2$ and ZrO$_2$; metals, such as, for example, Pt and Pd; and polymers, such as, for example, poly(amides) and poly(imides), can be used for the coating of the light-converting material in accordance with the present invention. Al$_2$O$_3$ is one of the best-investigated coating materials which is applied with the aid of the atom layer deposition (ALD) process. Al$_2$O$_3$ can be applied to a substrate by alternate use of trimethylaluminium and water vapour as corresponding metal and oxygen sources and flushing of the ALD chamber with an inert carrier gas, such as, for example, N$_2$ or Ar, between each of these applications.

The present invention furthermore relates to a light-converting mixture which comprises one or more of the light-converting materials according to the invention. It is also possible for the light-converting mixture to comprise one or more conversion phosphors besides the light-converting materials according to the invention. It is preferred for the light-converting materials and the conversion phosphors to emit light of different wavelengths which are complementary to one another. If the light-converting material according to the invention is a red-emitting material, this is preferably employed in combination with a cyan-emitting conversion phosphor or in combination with blue- and green- or yellow-emitting conversion phosphors. If the light-converting material according to the invention is a green-emitting material, this is preferably employed in combination with a magenta-emitting conversion phosphor or in combination with red- and blue-emitting conversion phosphors. It may thus be preferred for the light-converting material according to the invention to be employed in combination with one or more further conversion phosphors in the light-converting mixture according to the invention, so that white light is preferably emitted.

The light-converting mixture preferably comprises the light-converting material according to the invention in a ratio of 1 to 90% by weight, based on the total weight of the mixture.

In the context of this application, violet light denotes light whose emission maximum is below 420 nm, blue light denotes light whose emission maximum is between 420 and 469 nm, cyan light denotes light whose emission maximum is between 470 and 505 nm, green light denotes light whose emission maximum is between 506 and 545 nm, yellow light denotes light whose emission maximum is between 546 and 569 nm, orange light denotes light whose emission maximum is between 570 and 600 nm and red light denotes light whose emission maximum is between 601 and 670 nm. The light-converting material according to the invention is preferably a red- or green-emitting conversion material. Magenta arises through additive mixing of the maximum intensities for red and blue and corresponds to the decimal value (255, 0, 255) or the hexadecimal value (FF00FF) in the RGB gamut.

The conversion phosphors which can be employed together with the light-converting material according to the invention and form the light-converting mixture according to the invention are not subject to any particular restriction. It is therefore generally possible to employ any possible conversion phosphor. The following, for example, are suitable here: $Ba_2SiO_4:Eu^{2+}$, $BaSi_2O_5:Pb^{2+}$, $Ba_xSr_{1-x}F_2:Eu^{2+}$, $BaSrMgSi_2O_7:Eu^{2+}$, $BaTiP_2O_7$, $(Ba,Ti)_2P_2O_7:Ti$, $Ba_3WO_6:U$, $BaY_2F_8:Er^{3+},Yb^+$, $Be_2SiO_4:Mn^{2+}$, $Bi_4Ge_3O_{12}$, $CaAl_2O_4:Ce^{3+}$, $CaLa_4O_7:Ce^{3+}$, $CaAl_2O_4:Eu^{2+}$, $CaAl_2O_4:Mn^{2+}$, $CaAl_4O_7:Pb^{2+}$, $Mn^{2+}$, $CaAl_2O_4:Tb^{3+}$, $Ca_3Al_2Si_3O_{12}:Ce^{3+}$, $Ca_3Al_2Si_3O_{12}:Eu^{2+}$, $Ca_2B_5O_9Br:Eu^{2+}$, $Ca_2B_5O_9Cl:Eu^{2+}$, $Ca_2B_5O_9Cl:Pb^{2+}$, $CaB_2O_4:Mn^{2+}$, $Ca_2B_2O_5:Mn^{2+}$, $CaB_2O_4:Pb^{2+}$, $CaB_2P_2O_9:Eu^{2+}$, $Ca_5B_2SiO_{10}:Eu^{3+}$, $Ca_{0.5}Ba_{0.5}Al_{12}O_{19}:Ce^{3+},Mn^{2+}$, $Ca_2Ba_3(PO_4)_3Cl:Eu^{2+}$, $CaBr_2:Eu^{2+}$ in $SiO_2$, $CaCl_2:Eu^{2+}$ in $SiO_2$, $CaCl_2:Eu^{2+},Mn^{2+}$ in $SiO_2$, $CaF_2:Ce^{3+}$, $CaF_2:Ce^{3+},Mn^{2+}$, $CaF_2:Ce^{3+},Tb^{3+}$, $CaF_2:Eu^{2+}$, $CaF_2:Mn^{2+}$, $CaF_2:U$, $CaGa_2O_4:Mn^{2+}$, $CaGa_4O_7:Mn^{2+}$, $CaGa_2S_4:Ce^{3+}$, $CaGa_2S_4:Eu^{2+}$, $CaGa_2S_4:Mn^{2+}$, $CaGa_2S_4:Pb^{2+}$, $CaGeO_3:Mn^{2+}$, $CaI_2:Eu^{2+}$ in $SiO_2$, $CaI_2:Eu^{2+},Mn^{2+}$ in $SiO_2$, $CaLaBO_4:Eu^{3+}$, $CaLaB_3O_7:Ce^{3+},Mn^{2+}$, $Ca_2La_2BO_{6.5}:Pb^{2+}$, $Ca_2MgSi_2O_7$, $Ca_2MgSi_2O_7:Ce^{3+}$, $CaMgSi_2O_6:Eu^{2+}$, $Ca_3MgSi_2O_8:Eu^{2+}$, $Ca_2MgSi_2O_7:Eu^{2+}$, $CaMgSi_2O_6:Eu^{2+},Mn^{2+}$, $Ca_2MgSi_2O_7:Eu^{2+},Mn^{2+}$, $CaMoO_4$, $CaMoO_4:Eu^{3+}$, $CaO:Bi^{3+}$, $CaO:Cd^{2+}$, $CaO:Cu^+$, $CaO:Eu^{3+}$, $CaO:Eu^{3+}$, $Na^+$, $CaO:Mn^{2+}$, $CaO:Pb^{2+}$, $CaO:Sb^{3+}$, $CaO:Sm^{3+}$, $CaO:Tb^{3+}$, $CaO:Tl$, $CaO:Zn^{2+}$, $Ca_2P_2O_7:Ce^{3+}$, $\alpha\text{-}Ca_3(PO_4)_2:Ce^{3+}$, $\beta\text{-}Ca_3(PO_4)_2:Ce^{3+}$, $Ca_5(PO_4)_3Cl:Eu^{2+}$, $Ca_5(PO_4)_3Cl:Mn^{2+}$, $Ca_5(PO_4)_3Cl:Sb^{3+}$, $Ca_5(PO_4)_3Cl:Sn^{2+}$, $\beta\text{-}Ca_3(PO_4)_2:Eu^{2+},Mn^{2+}$, $Ca_5(PO_4)_3F:Mn^{2+}$, $Ca_5(PO_4)_3F:Sb^{3+}$, $Ca_5(PO_4)_3F:Sn^{2+}$, $\alpha\text{-}Ca_3(PO_4)_2:Eu^{2+}$, $\beta\text{-}Ca_3(PO_4)_2:Eu^{2+}$, $Ca_2P_2O_7:Eu^{2+}$, $Ca_2P_2O_7:Eu^{2+},Mn^{2+}$, $CaP_2O_6:Mn^{2+}$, $\alpha\text{-}Ca_3(PO_4)_2:Pb^{2+}$, $\alpha\text{-}Ca_3(PO_4)_2:Sn^{2+}$, $\beta\text{-}Ca_3(PO_4)_2:Sn^{2+}$, $\beta\text{-}Ca_2P_2O_7:Sn,Mn$, $\alpha\text{-}Ca_3(PO_4)_2:Tr$, $CaS:Bi^{3+}$, $CaS:Bi^{3+},Na$, $CaS:Ce^{3+}$, $CaS:Eu^{2+}$, $CaS:Cu^+,Na^+$, $CaS:La^{3+}$, $CaS:Mn^{2+}$, $CaSO_4:Bi$, $CaSO_4:Ce^{3+}$, $CaSO_4:Ce^{3+},Mn^{2+}$, $CaSO_4:Eu^{2+}$, $CaSO_4:Eu^{2+},Mn^{2+}$, $CaSO_4:Pb^{2+}$, $CaS:Pb^{2+}$, $CaS:Pb^{2+},Cl$, $CaS:Pb^{2+},Mn^{2+}$, $CaS:Pr^{3+},Pb^{2+},Cl$, $CaS:Sb^{3+}$, $CaS:Sb^{3+},Na$, $CaS:Sm^{3+}$, $CaS:Sn^{2+}$, $CaS:Sn^{2+},F$, $CaS:Tb^{3+}$, $CaS:Tb^{3+},Cl$, $CaS:Y^{3+}$, $CaS:Yb^{2+}$, $CaS:Yb^{2+},Cl$, $CaSi_3:Ce^{3+}$, $Ca_3SiO_4Cl_2:Eu^{2+}$, $Ca_3SiO_4Cl_2:Pb^{2+}$, $CaSi_3:Eu^{2+}$, $CaSi_3:Mn^{2+},Pb$, $CaSi_3:Pb^{2+}$, $CaSi_3:Pb^{2+},Mn^{2+}$, $CaSi_3:Ti^{4+}$, $CaSr_2(PO_4)_2:Bi^{3+}$, $\beta\text{-}(Ca,Sr)_3(PO_4)_2:Sn^{2+}Mn^{2+}$, $CaTi_{0.9}Al_{0.1}O_3:Bi^{3+}$, $CaTiO_3:Eu^{3+}$, $CaTiO_3:Pr^{3+}$, $Ca_5(VO_4)_3Cl$, $CaWO_4$, $CaWO_4:Pb^{2+}$, $CaWO_4:W$, $Ca_3WO_6:U$, $CaYAlO_4:Eu^{3+}$, $CaYBO_4:Bi^{3+}$, $CaYBO_4:Eu^{3+}$, $CaYB_{0.8}O_{3.7}:Eu^{3+}$, $CaY_2ZrO_6:Eu^{3+}$, $(Ca,Zn,Mg)_3(PO_4)_2:Sn$, $CeF_3$, $(Ce,Mg)BaAl_{11}O_{18}:Ce$, $(Ce,Mg)SrAl_{11}O_{18}:Ce$, $CeMgAl_{11}O_{19}:Ce:Tb$, $Cd_2B_6O_{11}:Mn^{2+}$, $CdS:Ag^+,Cr$, $CdS:In$, $CdS:In$, $CdS:In,Te$, $CdS:Te$, $CdWO_4$, $CsF$, $CsI$, $CsI:Na^+$, $CsI:Tl$, $(ErCl_3)_{0.25}(BaCl_2)_{0.75}$, $GaN:Zn$, $Gd_3Ga_5O_{12}:Cr^{3+}$, $Gd_3Ga_5O_{12}:Cr,Ce$, $GdNbO_4:Bi^{3+}$, $Gd_2O_2S:Eu^{3+}$, $Gd_2O_2SPr^{3+}$, $Gd_2O_2S:Pr,Ce,F$, $Gd_2O_2S:Tb^{3+}$, $Gd_2SiO_5:Ce^{3+}$, $KAl_{11}O_{17}:Tl^+$, $KGa_{11}O_{17}:Mn^{2+}$, $K_2La_2Ti_3O_{10}:Eu$, $KMgF_3:Eu^{2+}$, $KMgF_3:Mn^{2+}$, $K_2SiF_6:Mn^{4+}$, $LaAl_3B_4O_{12}:Eu^{3+}$, $LaAlB_2O_6:Eu^{3+}$, $LaAlO_3:Eu^{3+}$, $LaAlO_3:Sm^{3+}$, $LaAsO_4:Eu^{3+}$, $LaBr_3:Ce^{3+}$, $LaBO_3:Eu^{3+}$, $(La,Ce,Tb)PO_4:Ce:Tb$, $LaCl_3:Ce^{3+}$, $La_2O_3:Bi^{3+}$, $LaOBr:Tb^{3+}$, $LaOBr:Tm^{3+}$, $LaOCl:Bi^{3+}$, $LaOCl:Eu^{3+}$, $LaOF:Eu^{3+}$, $La_2O_3:Eu^{3+}$, $La_2O_3:Pr^{3+}$, $La_2O_2S:Tb^{3+}$, $LaPO_4:Ce^{3+}$, $LaPO_4:Eu^{3+}$, $LaSi_3Cl:Ce^{3+}$, $LaSiO_3Cl:Ce^{3+},Tb^{3+}$, $LaVO_4:Eu^{3+}$, $La_2W_3O_{12}:Eu^{3+}$, $LiAlF_4:Mn^{2+}$, $LiAl_5O_8:Fe^{3+}$, $LiAlO_2:Fe^{3+}$, $LiAlO_2:Mn^{2+}$, $LiAl_5O_8:Mn^{2+}$, $Li_2CaP_2O_7:Ce^{3+},Mn^{2+}$, $LiCeBa_4Si_4O_{14}:Mn^{2+}$, $LiCeSrBa_3Si_4O_{14}:Mn^{2+}$, $LiInO_2:Eu^{3+}$, $LiInO_2:Sm^{3+}$, $LiLaO_2:Eu^{3+}$, $LuAlO_3:Ce^{3+}$, $(Lu,Gd)_2SiO_5:Ce^{3+}$, $Lu_2SiO_5:Ce^{3+}$, $Lu_2Si_2O_7:Ce^{3+}$, $LuTaO_4:Nb^{5+}$, $Lu_{1-x}Y_xAlO_3:Ce^{3+}$, $MgAl_2O_4:Mn^{2+}$, $MgSrAl_{10}O_{17}:Ce$, $MgB_2O_4:Mn^{2+}$, $MgBa_2(PO_4)_2:Sn^{2+}$, $MgBa_2(PO_4)_2:U$, $MgBaP_2O_7:Eu^{2+}$, $MgBaP_2O_7:Eu^{2+},Mn^{2+}$, $MgBa_3Si_2O_8:Eu^{2+}$, $MgBa(SO_4)_2:Eu^{2+}$, $Mg_3Ca_3(PO_4)_4:Eu^{2+}$, $MgCaP_2O_7:Mn^{2+}$, $Mg_2Ca(SO_4)_3:Eu^{2+}$, $Mg_2Ca(SO_4)_3:Eu^{2+},Mn^2$, $MgCeAl_{11}O_{19}:Tb^{3+}$, $Mg_4(F)GeO_6:Mn^{2+}$, $Mg_4(F)(Ge,Sn)O_6:Mn^{2+}$, $MgF_2:Mn^{2+}$, $MgGa_2O_4:Mn^{2+}$, $Mg_8Ge_2O_{11}F_2:Mn^{4+}$, $MgS:Eu^{2+}$, $MgSiO_3:Mn^{2+}$, $Mg_2SiO_4:Mn^{2+}$, $Mg_3Si_3F_4:Ti^{4+}$, $MgSO_4:Eu^{2+}$, $MgSO_4:Pb^{2+}$, $(Mg,Sr)Ba_2Si_2O_7:Eu^{2+}$, $MgSrP_2O_7:Eu^{2+}$, $MgSr_5(PO_4)_4:Sn^{2+}$, $MgSr_3Si_2O_8:Eu^{2+},Mn^{2+}$, $Mg_2Sr(SO_4)_3:Eu^{2+}$, $Mg_2TiO_4:Mn^{4+}$, $MgWO_4$, $MgYBO_4:Eu^{3+}$, $Na_3Ce(PO_4)_2:Tb^{3+}$, $NaI:Tl$, $Na_{1.23}K_{0.42}Eu_{0.12}TiSi_4O_{11}:Eu^{3+}$, $Na_{1.23}K_{0.42}Eu_{0.12}TiSi_5O_{13}.xH_2O:Eu^{3+}$, $Na_{1.29}K_{0.46}Er_{0.08}TiSi_4O_{11}:Eu^{3+}$, $Na_2Mg_3Al_2Si_2O_{10}:Tb$, $Na(Mg_{2-x},Mn_x)LiSi_4O_{10}F_2:Mn$, $NaYF_4:Er^{3+},Yb^{3+}$, $NaYO_2:Eu^{3+}$, $P46(70\%)+P47$ $(30\%)$, $SrAl_{12}O_{19}:Ce^{3+}$, $Mn^{2+}$, $SrAl_2O_4:Eu^{2+}$, $SrAl_4O_7:Eu^{3+}$, $SrAl_{12}O_{19}:Eu^{2+}$, $SrAl_2S_4:Eu^{2+}$, $Sr_2B_5O_9Cl:Eu^{2+}$, $SrB_4O_7:Eu^{2+}(F,Cl,Br)$, $SrB_4O_7:Pb^{2+}$, $SrB_4O_7:Pb^{2+},Mn^{2+}$, $SrB_8O_{13}:Sm^{2+}$, $Sr_xBa_yCl_zAl_2O_{4-z/2}:Mn^{2+}$, $Ce^{3+}$, $SrBaSiO_4:Eu^{2+}$, $Sr(Cl,Br,I)_2:Eu^{2+}$ in $SiO_2$, $SrCl_2:Eu^{2+}$ in $SiO_2$, $Sr_5Cl(PO_4)_3:Eu$, $Sr_wF_xB_4O_{6.5}:Eu^{2+}$, $Sr_wF_xB_yO_z:Eu^{2+},Sm^{2+}$, $SrF_2:Eu^{2+}$, $SrGa_{12}O_{19}:Mn^{2+}$, $SrGa_2S_4:Ce^{3+}$, $SrGa_2S_4:Eu^{2+}$, $SrGa_2S_4:Pb^{2+}$, $SrIn_2O_4:Pr^{3+},Al^{3+}$, $(Sr,Mg)_3(PO_4)_2:Sn$, $SrMgSi_2O_6:Eu^{2+}$, $Sr_2MgSi_2O_7:Eu^{2+}$, $Sr_3MgSi_2O_8:Eu^{2+}$, $SrMoO_4:U$, $SrO\cdot3B_2O_3:Eu^{2+},Cl$, $\beta\text{-}SrO\cdot3B_2O_3:Pb^{2+}$, $\beta\text{-}SrO\cdot3B_2O_3:Pb^{2+},Mn^{2+}$, $\alpha\text{-}SrO\cdot3B_2O_3:Sm^{2+}$, $Sr_6P_5BO_{20}:Eu$, $Sr_5(PO_4)_3Cl:Eu^{2+}$, $Sr_5(PO_4)_3Cl:Eu^{2+},Pr^{3+}$, $Sr_5(PO_4)_3Cl:Mn^{2+}$, $Sr_5(PO_4)_3Cl:Sb^{3+}$, $Sr_2P_2O_7:Eu^{2+}$, $\beta\text{-}Sr_3(PO_4)_2:Eu^{2+}$, $Sr_5(PO_4)_3F:Mn^{2+}$, $Sr_5(PO_4)_3F:Sb^{3+}$, $Sr_5(PO_4)_3F:Sb^{3+},Mn^{2+}$, $Sr_5(PO_4)_3F:Sn^{2+}$, $Sr_2P_2O_7:Sn^{2+}$, $\beta\text{-}Sr_3(PO_4)_2:Sn^{2+}$, $\beta\text{-}Sr_3(PO_4)_2:Sn^{2+},Mn^{2+}(Al)$, $SrS:Ce^{3+}$, $SrS:Eu^{2+}$, $SrS:Mn^{2+}$, $SrS:Cu^+,Na$, $SrSO_4:Bi$, $SrSO_4:Ce^{3+}$, $SrSO_4:Eu^{2+}$, $SrSO_4:Eu^{2+},Mn^{2+}$, $Sr_5Si_4O_{10}Cl_6:Eu^{2+}$, $Sr_2SiO_4:Eu^{2+}$, $SrTiO_3:Pr^{3+}$, $SrTiO_3:Pr^{3+},Al^{3+}$, $Sr_3WO_6:U$, $SrY_2O_3:Eu^{3+}$, $ThO_2:Eu^{3+}$, $ThO_2:Pr^{3+}$, $ThO_2:Tb^{3+}$, $YAl_3B_4O_{12}:Bi^{3+}$, $YAl_3B_4O_{12}:Ce^{3+}$, $YAl_3B_4O_{12}:Ce^{3+},Mn$, $YAl_3B_4O_{12}:Ce^{3+},Tb^{3+}$, $YAl_3B_4O_{12}:Eu^{3+}$, $YAl_3B_4O_{12}:Eu^{3+},Cr^{3+}$, $YAl_3B_4O_{12}:Th^{4+},Ce^{3+},Mn^{2+}$, $YAlO_3:Ce^{3+}$, $Y_3Al_5O_{12}:Ce^{3+}$, $Y_3Al_5O_{12}:Cr^{3+}$, $YAlO_3:Eu^{3+}$, $Y_3Al_5O_{12}:Eu^{3r}$, $Y_4Al_2O_9:Eu^{3+}$, $Y_3Al_5O_{12}:Mn^{4+}$, $YAlO_3:Sm^{3+}$, $YAlO_3:Tb^{3+}$, $Y_3Al_5O_{12}:Tb^{3+}$, $YAsO_4:Eu^{3+}$, $YBO_3:Ce^{3+}$, $YBO_3:Eu^{3+}$, $YF_3:Er^{3+},Yb^{3+}$, $YF_3:Mn^{2+}$, $YF_3:Mn^{2+},Th^{4+}$, $YF_3:Tm^{3+},Yb^{3+}$, $(Y,Gd)BO_3:Eu$, $(Y,Gd)BO_3:Tb$, $(Y,Gd)_2O_3:Eu^{3+}$, $Y_{1.34}Gd_{0.60}O_3(Eu,Pr)$, $Y_2O_3:Bi^{3+}$, $YOBrEu^{3+}$, $Y_2O_3:Ce$, $Y_2O_3:Er^{3+}$, $Y_2O_3:Eu^{3+}(YOE)$, $Y_2O_3:Ce^{3+},Tb^{3+}$, $YOCl:Ce^{3+}$, $YOCl:Eu^{3+}$, $YOF:Eu^{3+}$, $YOF:Tb^{3+}$, $Y_2O_3:Ho^{3+}$, $Y_2O_2S:Eu^{3+}$, $Y_2O_2S:Pr^{3+}$, $Y_2O_2S:Tb^{3+}$, $Y_2O_3:Tb^{3+}$, $YPO_4:Ce^{3+}$, $YPO_4:Ce^{3+},Tb^{3+}$, $YPO_4:Eu^{3+}$, $YPO_4:Mn^{2+},Th^{4+}$, $YPO_4:V^{5+}$, $Y(P,V)O_4:Eu$, $Y_2SiO_5:Ce^{3+}$, $YTaO_4$, $YTaO_4:Nb^{5+}$, $YVO_4:Dy^{3+}$, $YVO_4:Eu^{3+}$, $ZnAl_2O_4:Mn^{2+}$, $ZnB_2O_4:Mn^{2+}$, $ZnBa_2S_3:Mn^{2+}$, $(Zn,Be)_2SiO_4:Mn^{2+}$, $Zn_{0.4}Cd_{0.6}S:Ag$, $Zn_{0.6}Cd_{0.4}S:Ag$, $(Zn,Cd)S:Ag,Cl$, $(Zn,Cd)S:Cu$, $ZnF_2:Mn^{2+}$, $ZnGa_2O_4$, $ZnGa_2O_4:Mn^{2+}$, $ZnGa_2S_4:Mn^{2+}$, $Zn_2GeO_4:Mn^{2+}$, $(Zn,Mg)F_2:Mn^{2+}$, $ZnMg_2(PO_4)_2:Mn^{2+}$, $(Zn,Mg)_3(PO_4)_2:Mn^{2+}$, $ZnO:Al^{3+},Ga^{3+}$, $ZnO:Bi^{3+}$, $ZnO:Ga^{3+}$, $ZnO:Ga$, $ZnO$—$CdO:Ga$, $ZnO:S$, $ZnO:Se$, $ZnO:Zn$, $ZnS:Ag^+,Cl^-$, $ZnS:Ag,Cu,Cl$, $ZnS:Ag,Ni$, $ZnS:Au,In$, $ZnS$—$CdS$ (25-75), $ZnS$—$CdS$ (50-50), $ZnS$—$CdS$ (75-25), ZnS—CdS:Ag,Br,Ni, ZnS—CdS:Ag$^+$,Cl, ZnS—CdS:Cu, Br, ZnS—CdS:Cu,I, ZnS:Cl$^-$, ZnS:Eu$^{2+}$, ZnS:Cu, ZnS:Cu$^+$, Al$^{3+}$, ZnS:Cu$^+$,Cl$^-$, ZnS:Cu,Sn, ZnS:Eu$^{2+}$, ZnS:Mn$^{2+}$, ZnS: Mn,Cu, ZnS:Mn$^{2+}$,Te$^{2+}$, ZnS:P, ZnS:Pb$^{2+}$, ZnS:Pb$^{2+}$,Cl$^-$, ZnS:Pb,Cu, Zn$_3$(PO$_4$)$_2$:Mn$^{2+}$, Zn$_2$SiO$_4$:Mn$^{2+}$, Zn$_2$SiO$_4$: Mn$^{2+}$,As$^{5+}$, Zn$_2$SiO$_4$:Mn,Sb$_2$O$_2$, Zn$_2$SiO$_4$:Mn$^{2+}$,P, Zn$_2$SiO$_4$: Ti$^{4+}$, ZnS:Sn$^{2+}$, ZnS:Sn,Ag, ZnS:Sn$^{2+}$,Li$^+$, ZnS:Te,Mn, ZnS—ZnTe:Mn$^{2+}$, ZnSe:Cu$^+$,Cl and ZnWO$_4$.

The light-converting material or the light-converting mixture in accordance with the present invention can be used for the partial or complete conversion of ultraviolet and/or blue light into light having a longer wavelength, such as, for example, green or red light. The present invention thus furthermore relates to the use of the light-converting material or light-converting mixture in a light source. The light source is particularly preferably an LED, in particular a phosphor-converted LED, pc-LED for short. It is particularly preferred here for the light-converting material to be mixed with at least one further light-converting material and/or one or more conversion phosphors and thus to form a light-converting mixture, which emits, in particular, white light or light having a certain colour point (colour-on-demand principle).

"Colour-on-demand principle" is taken to mean the generation of light of a certain colour point by means of a pc-LED using one or more light-emitting materials and/or conversion phosphors.

The present invention thus furthermore relates to a light source which contains a primary light source and at least one light-converting material according to the invention or at least one light-converting mixture according to the invention. Here too, it is particularly preferred for the light source, besides the light-converting material according to the invention, also to contain a further light-converting material according to the invention and/or a conversion phosphor, so that the light source preferably emits white light or light having a certain colour point.

The light source according to the invention is preferably a pc-LED which comprises a primary light source and a light-converting material or a light-converting mixture. The light-converting material or the light-converting mixture is preferably formed in the form of a layer, where the layer may comprise a multiplicity of part-layers, where each of the part-layers may comprise a different light-converting material or a different light-converting mixture. The layer may thus either comprise a single light-converting material or a single light-converting mixture or a multiplicity of part-layers, where each part-layer in turn comprises a different light-converting material or a different light-converting mixture. The thickness of the layer can be in the range from a few millimetres to a few microns, preferably in the range between 2 mm and 40 μm, depending on the particle size of the light-converting material or light-converting mixture and the requisite optical features.

In some embodiments for modulation of the emission spectrum of an LED, a single layer or a layer having part-layers may be formed on the primary light source. The layer or the layer having part-layers may either be arranged directly on the primary light source or separated from the primary light source by air, vacuum or a filling material. The filling material (for example silicone or epoxy) can serve as thermal insulation and/or as optical scattering layer. The modulation of the emission spectrum of the primary light source can serve lighting purposes in order to generate light emission having a broad colour spectrum, for example "white" light having a high colour rendering index (CRI) and the desired correlated colour temperature (CCT). The light emission having a broad colour spectrum is generated by converting part of the light originally generated by the primary light source into longer-wave light. An increase in the intensity of red is important in order to obtain "warmer" light having a lower CCT (for example 2,700-3,500 K), but also "smoothing" of specific regions in the spectrum, such as, for example, in the transition from blue to green, can likewise improve the CRI. The modulation of the LED lighting can also be used for optical display purposes.

The light-converting material according to the invention or the light-converting mixture according to the invention may be dispersed in a casting material, such as, for example, a glass, silicone or epoxy resin, or formed as ceramic material. The casting material is a light-transmitting matrix material which includes the light-converting material according to the invention or the light-converting mixtures according to the invention. Preferred examples of the casting material, which should in no way be regarded as limiting, are mentioned above. The light-converting material or the light-converting mixture is preferably employed in a ratio of 3 to 80% by weight, based on the casting material, depending on the desired optical properties and the structure of the application.

In a preferred embodiment, the light-converting material according to the invention or the light-converting mixture according to the invention is arranged directly on the primary light source.

In an alternative preferred embodiment, the light-converting material according to the invention or the light-converting mixture according to the invention is arranged on a support material remote from the primary light source (so-called remote phosphor principle).

The primary light source of the light source according to the invention can be a semiconductor chip, a luminescent light source, such as ZnO, a so-called TCO (transparent conducting oxide), a ZnSe- or SiC-based arrangement, an arrangement based on an organic light-emitting layer (OLED) or a plasma or discharge source, most preferably a semiconductor chip. If the primary light source is a semiconductor chip, it is preferably a luminescent indium aluminium gallium nitride (InAlGaN), as is known from the prior art. Possible forms of primary light sources of this type are known to the person skilled in the art. Lasers are furthermore suitable as light source.

The light-converting material according to the invention or the light-converting mixture according to the invention can be converted into any desired outer shapes, such as, for example, spherical particles, flakes and structured materials and ceramics, for use in light sources, in particular pc-LEDs. These shapes are summarised under the term "shaped bodies". The shaped bodies are consequently light-converting shaped bodies.

The present invention furthermore relates to a process for the production of a light source, in which the light-converting material or the light-converting mixture is applied to the primary light source or the support material in the form of a film by spin coating or spray coating or in the form of a film as laminate.

The invention furthermore relates to a lighting unit which contains at least one light source according to the invention. The use of the lighting unit is not subject to any particular restriction. Thus, the lighting unit can be employed, for example, in optical display devices, in particular liquid-crystal display devices (LC displays), having backlighting. The present invention therefore also relates to a display device of this type. In the lighting unit according to the invention, the optical coupling between the light-converting material or the light-converting mixture and the primary light source (in particular semiconductor chip) is preferably effected by a light-conducting arrangement or device. This makes it possible for the primary light source to be installed at a central location and to be optically coupled to the light-converting material or the light-converting mixture by means of light-conducting devices, such as, for example, light-conducting fibres. In this way, lamps matched to the lighting wishes, consisting of one or more different light-converting materials or mixtures, which may be arranged to form a light screen, and an optical waveguide, which is coupled to the primary light source, can be achieved. This makes it possible to place a strong primary light source at a location which is favourable for electrical installation and to install lamps comprising light-converting materials or mixtures which are coupled to the optical waveguides at any desired locations without further electrical cabling, only by laying optical waveguides.

The following examples and figures are intended to illustrate the present invention. However, they should in no way be regarded as limiting.

EXAMPLES

All emission spectra were recorded in an Ulbricht sphere combined with an OceanOptics HR 4000 spectrometer. The excitation light source used for recording powder spectra is a halogen cold-light source with monochromator. The LEDs tested are operated by means of a Keithley SourceMeter (the 3528 LED with ~450 nm chip wavelength at 20 mA was used for the experiments shown here).

The particle-size distributions were recorded using a Beckman Coulter Multisizer III in isotonic saline solution. >100,000 particles were measured in each case.

Working examples for the preparation of the light-converting material
Red:

Example 1

100 g of a white pulverulent, unactivated aluminate ($Y_3Al_5O_{12}$) are suspended in 150 ml of heptane in a 500 ml flask. 33 ml of a red quantum rod solution (3% by weight of CdSe/CdS nanorods in heptane, stabilised by means of TOP, TOPO and ODPA) are added to the suspension. This suspension is mixed at RT without vacuum for 2 h. The solvent is carefully removed in a rotary evaporator in vacuo at a water-bath temperature of 40° C. The coated garnet powder is dried overnight (vacuum/25° C.). Finally, the coated system is sieved to a particle size of <64 μm.

Example 2

15 g of a white pulverulent, unactivated silicate ($Sr_3SiO_5$) are suspended in 100 ml of water in a 250 ml flask. 4.5 ml of a red quantum rod solution (3% by weight of CdSe/CdS nanorods in water, stabilised by means of PEI) are added to the suspension. This suspension is mixed by means of a rotary evaporator at 60 rpm at RT without vacuum for 3 h. Better homogenisation is ensured by the addition of small $Al_2O_3$ beads. The solvent is carefully removed in the rotary evaporator in vacuo at a water-bath temperature of 40° C. For complete removal of the solvent, the coated silicate is left in the rotary evaporator in vacuo at RT for about 12 further hours. Finally, the coated system is sieved to a particle size of <64 μm.

Example 3

10 g of a white pulverulent, unactivated titanate ($Mg_2TiO_4$) are suspended in 50 ml of toluene in a 100 ml flask. 3 ml of a red quantum rod solution (3% by weight of CdSe/CdS nanorods in toluene, stabilised by means of TOP, TOPO and ODPA) are added to the suspension. This suspension is stirred at RT without vacuum for 3 h. The coated titanate is subsequently filtered off via a frit with suction and, for complete drying, left to stand at RT in vacuo overnight. Finally, the coated system is sieved to a particle size of <64 μm.

Green:

Example 4

15 g of a white pulverulent, unactivated aluminate ($Y_3Al_5O_{12}$) are suspended in 80 ml of heptane in a 500 ml flask. 4.5 ml of a green quantum rod solution (3% by weight of CdSe/CdS nanorods in heptane, stabilised by means of TOP, TOPO and ODPA) are added to the suspension. This suspension is mixed by means of a rotary evaporator at 60 rpm at RT without vacuum for 2 h. Better homogenisation is ensured by the addition of small $Al_2O_3$ beads. The solvent is carefully removed in the rotary evaporator in vacuo at a water-bath temperature of 40° C. For complete removal of the solvent, the coated garnet is dried at RT in vacuo overnight. Finally, the coated system is sieved to a particle size of <64 μm.

Measurement of the Light-Converting Materials Prepared

Figure 2:
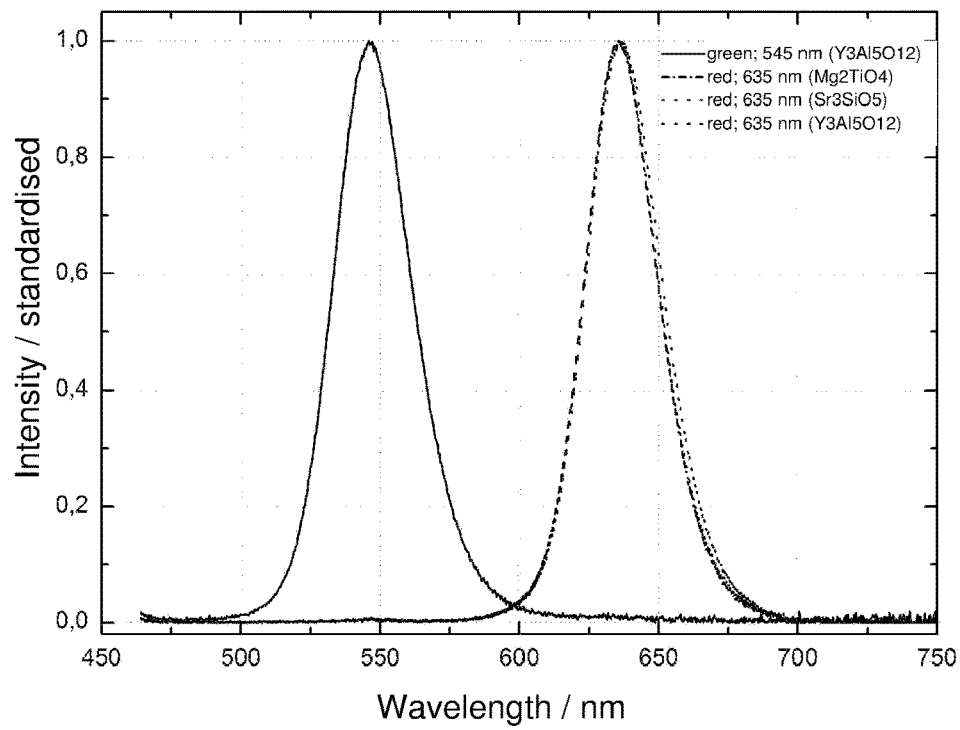
FIG. 2: Relative spectral energy distribution of the emission of the light-converting materials prepared from Examples 1 to 4.

The relative spectral energy distribution of all light-converting materials obtained was recorded by means of a fibre-optic spectrometer at an excitation wavelength of 450 nm. Furthermore, the absorption at different excitation wavelengths was determined. Absorption spectra of all light-converting materials prepared are shown in FIG. 1. The relative spectral energy distribution of all materials prepared (emission) is shown in FIG. 2.

LED Evaluation

Unfilled LEDs are filled with an optical silicone (Dow Corning OE6550) in which precise amounts of red and green particles are suspended via a dispenser. The silicone suspension is prepared by means of a biaxial rotary mixer and subsequently degassed in vacuo. The LED is subsequently hardened in a drying cabinet at 140° C. for 5 h and measured with respect to the resultant light emission by means of an Ulbricht sphere using a fibre-optic spectrometer. By variation of the total amount of powder in the silicone and also of the red, yellow or green individual components, virtually any colour location in the colour triangle can be achieved.

Instead of silicone, it is also possible to use other highly transparent materials as casting composition, for example epoxy resins.

Figure 3:
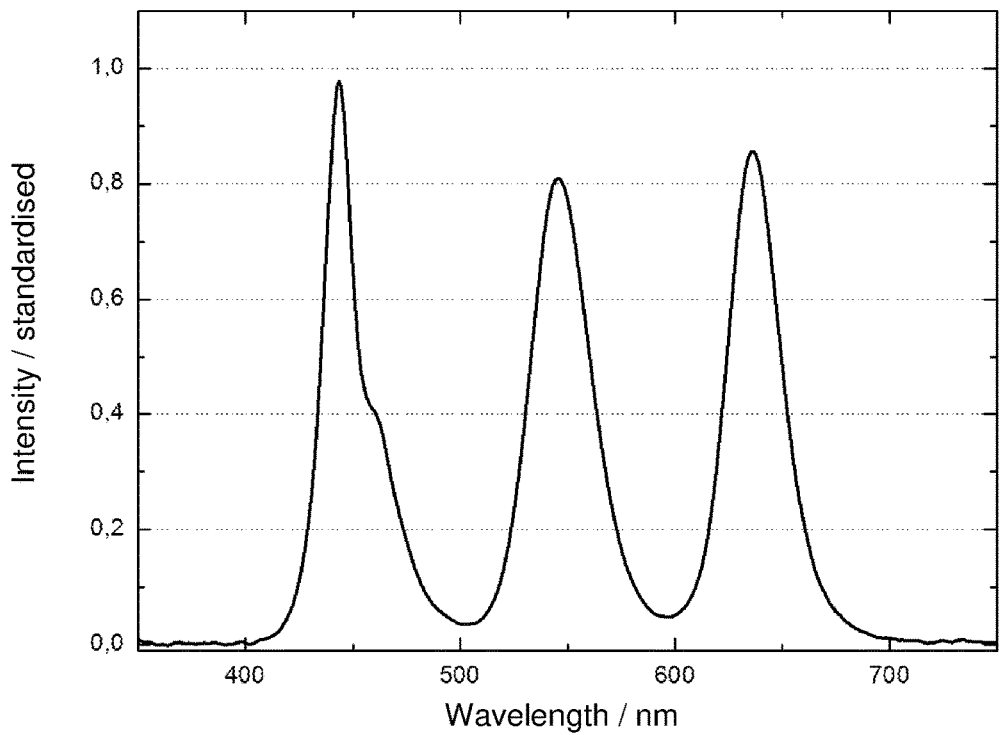
FIG. 3: Emission spectrum LED 1: red QD ($\lambda_{max}$=635 nm) on $Sr_3SiO_5$ combined with green QD ($\lambda_{max}$=543 nm) on $Y_3Al_5O_{12}$ in a blue LED ($\lambda_{max}$=450 nm) with colour coordinates x~0.31 and y~0.31; NTSC with standard colour filter is 100%.

LED 1: red QD ($\lambda_{max}$=635 nm) on $Sr_3SiO_5$ combined with green QD ($\lambda_{max}$=543 nm) on $Y_3Al_5O_{12}$ in a blue LED ($\lambda_{max}$=450 nm) with colour coordinates x~0.31 and y~0.31; NTSC with standard colour filter is 100%. FIG. 3 shows the emission spectrum of LED 1.

Figure 4:
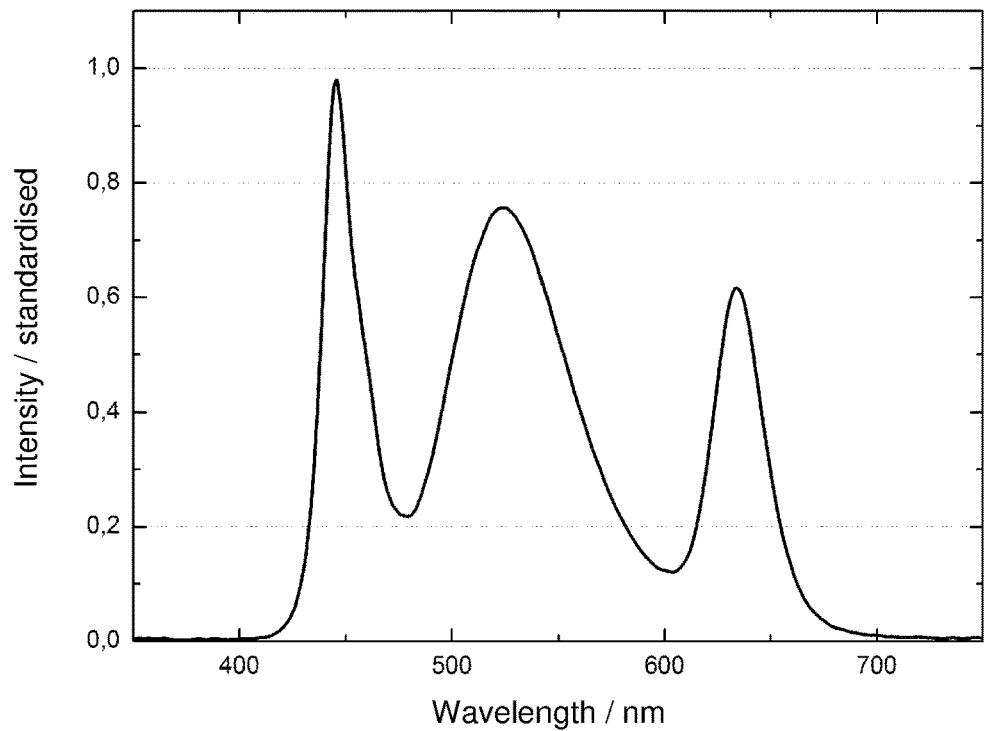
FIG. 4: Emission spectrum LED 2: red QD ($\lambda_{max}$=635 nm) on $Sr_3SiO_5$ combined with green silicate phosphor ($\lambda_{max}$=520 nm) in a blue LED ($\lambda_{max}$=450 nm) with colour coordinates x~0.31 and y~0.31; NTSC with standard colour filter is 98%.

LED 2: red QD ($\lambda_{max}$=635 nm) on $Sr_3SiO_5$ combined with green silicate phosphor ($\lambda_{max}$=520 nm) in a blue LED ($\lambda_{max}$=450 nm) with colour coordinate x~0.31 and y~0.31; NTSC with standard colour filter is 98%. FIG. 4 shows the emission spectrum of LED 2.

Figure 5:
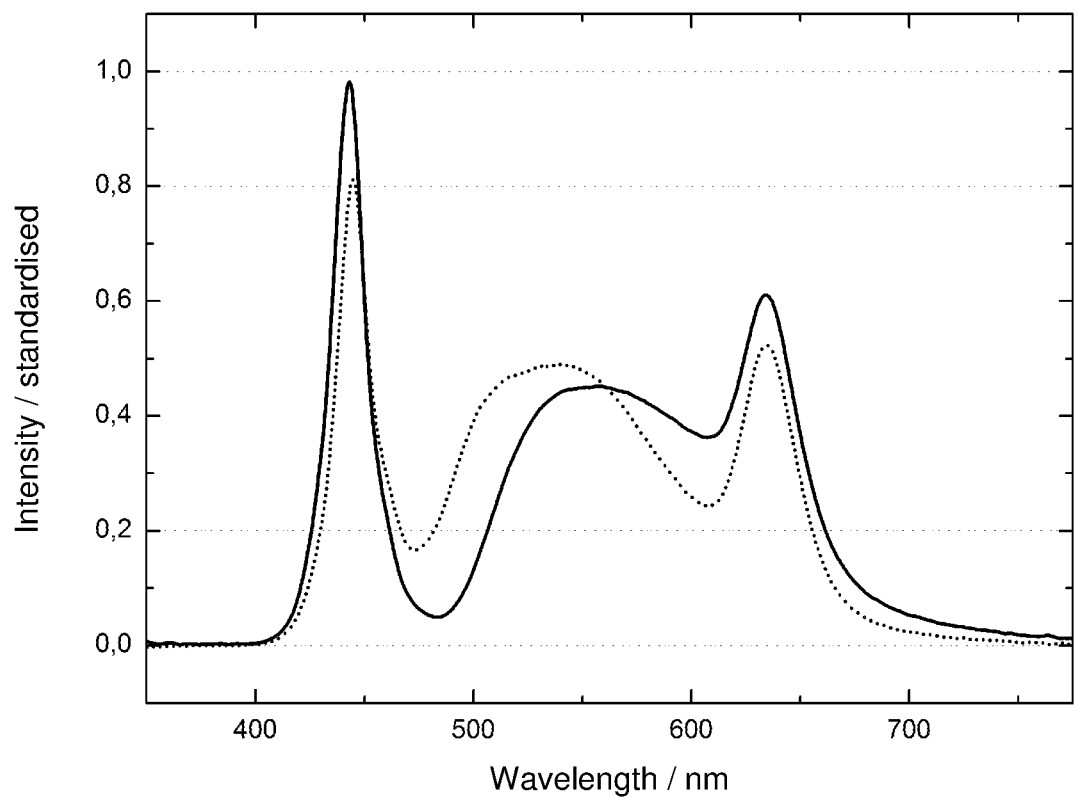
FIG. 5: Emission spectrum LED 3: red QD ($\lambda_{max}$=635 nm) on $Y_3Al_5O_{12}$ in a mixture with green $Lu_3Al_5O_{12}$:Ce ($\lambda_{max}$=540 nm, CRI 85, dotted line) and in a mixture with yellow $Y_3Al_5O_{12}$:Ce ($\lambda_{max}$=560 nm, CRI 80, solid line).

LED 3: red QD ($\lambda_{max}$=635 nm) on $Y_3Al_5O_{12}$ in a mixture with green $Lu_3Al_5O_{12}$:Ce ($\lambda_{max}$=540 nm, CRI 85, dotted line) and in a mixture with yellow $Y_3Al_5O_{12}$:Ce ($\lambda_{max}$=560 nm, CRI 80, solid line). FIG. 5 shows the emission spectrum of LED 3.

Further useful advantages of the light-converting materials according to the invention:

NTSC with standard colour filter in conventional 450 nm LED, green phosphor β-sialon 535 and red phosphor $K_2SiF_6$ only reaches 94%.

Same sedimentation behaviour over all conversion materials used in the LED, can be adjusted specifically if desired and increased production yield in the LED production process.

Little reabsorption in the green/yellow spectral region, thus less double conversion and increased efficiencies as well as better predictability of the LED spectrum.

Simple to use, since no new production equipment is required by the LED manufacturer.

User has more opportunity to adjust the LED emission compared with conventional QD films or QDs on activated phosphors (flexible use, since user does not have to use a different light converter for each colour location).

Increased brightness of the LED, since the red, narrow-band emission does not waste any energy in the deep long-wave spectral region with low eye sensitivity.

Existing coating technologies for phosphors can be used; additional barrier films are not necessary.

The invention claimed is:

1. A light-converting material comprising semiconductor nanoparticles and an unactivated crystalline material, where the semiconductor nanoparticles are located on the surface of the unactivated crystalline material,
where the unactivated crystalline material is a matrix material of an inorganic phosphor selected from the list consisting of: unactivated crystalline phosphates and halophosphates, unactivated crystalline borates and borosilicates, unactivated crystalline aluminates, gallates and alumosilicates, unactivated crystalline molybdates and tungstates, unactivated crystalline sulfides, selenides and tellurides, unactivated crystalline nitrides and oxynitrides, unactivated crystalline SiAlONs and other unactivated crystalline materials selected from unactivated crystalline complex metal-oxygen compounds, unactivated crystalline oxysulfides or oxychlorides and unactivated crystalline silicates or halosilicates selected from the list consisting of $M^{2+}SiO_3$, $M^{2+}_2SiO_4$, $M^{2+}_2(Si,Ge)O_4$, $M^{2+}_3SiO_5$, $M^{3+}_2SiO_5$, $M^{3+}M^+SiO_4$, $M^{2+}Si_2O_5$, $M^{2+}_2Si_2O_6$, $M^{2+}_3Si_2O_7$, $M^{2+}_2M^+_2Si_2O_7$, $M^{3+}_2Si_2O_7$, $M^{2+}_4Si_2O_8$, $M^{2+}_2Si_3O_8$, $M^{2+}_3M^{3+}_2Si_3O_{12}$, $M^+M^{3+}M^{2+}_4Si_4O_{10}$, $M^+M^{2+}_4M^{3+}_3Si_4O_{14}$, $M^{2+}_3M^{3+}_2Si_6O_{18}$, $M^{3+}SiO_3X$, $M^{2+}_3SiO_4X_2$, $M^{2+}_5SiO_4X_6$, $M^+_2M^{2+}_2Si_4O_{10}X_2$, $M^+_5Si_4O_{10}X_6$, $M^+_2SiX_6$, $M^{2+}_3SiO_3X_4$ and $M^{2+}_9(SiO_4)_4X_2$; where $M^+$ is one or more alkali metals; $M^{2+}$ is Zn, Fe, Co, Ni, Cd, Cu and/or one or more alkaline-earth metals; $M^{3+}$ is Al, Sc, Y, La and/or one or more rare-earth metals selected from Sc, Y, La, Ce, Pr, Nd, Pm, Sm, Eu, Gd, Tb, Dy, Ho, Er, Tm, Yb and Lu; and X is one or more halogens.

2. A light-converting material according to claim 1, wherein the unactivated crystalline material is an unactivated crystalline silicate or halosilicate, as defined in claim 1.

3. A light-converting material according to claim 2, wherein the alkali metals are Li, Na and/or K; the alkaline-earth metals are Be, Mg, Ca, Sr and/or Ba; and the halogens are F, Cl, Br and/or I.

4. A light-converting material according to claim 1, wherein the unactivated crystalline material is an unactivated crystalline phosphate or halophosphate selected from the list consisting of $M^{3+}PO_4$, $M^{2+}P_2O_6$, $M^{2+}_2P_2O_7$, $M^+_2M^{2+}P_2O_7$, $M^{4+}P_2O_7$, $M^{2+}B_2P_2O_9$, $M^{2+}_6BP_5O_{20}$, $M^{2+}_3(PO_4)_2$, $M^+_3M^{3+}(PO_4)_2$, $M^{2+}_6(PO_4)_4$ and $M^{2+}_5(PO_4)_3X$; where $M^+$is one or more alkali metals; $M^{2+}$is Zn, Fe, Co, Ni, Cd, Cu and/or one or more alkaline-earth metals; $M^{3+}$ is Al, Sc, Y, La and/or one or more rare-earth metals selected from Sc, Y, La, Ce, Pr, Nd, Pm, Sm, Eu, Gd, Tb, Dy, Ho, Er, Tm, Yb and Lu; $M^{4+}$ is Ti, Zr, Ge and/or Sn; and X is one or more halogens.

5. A light-converting material according to claim 4, wherein the alkali metals are Li, Na and/or K; the alkaline-earth metals are Be, Mg, Ca, Sr and/or Ba; and the halogens are F, Cl, Br and/or I.

6. A light-converting material according to claim 1, wherein the unactivated crystalline material is an unactivated crystalline borate or borosilicate selected from the list consisting of $M^{3+}BO_3$, $M^{2+}B_2O_4$, $M^{2+}_2B_2O_5$, $M^{3+}_2B_2O_6$, $M^{3+}B_3O_6$, $M^{2+}B_6O_{10}$, $M^{2+}M^{3+}BO_4$, $M^{2+}M^{3+}B_3O_7$, $M^{2+}B_4O_7$, $M^{2+}_3M^{3+}_2B_4O_{12}$, $M^{3+}_4B_4O_{12}$, $M^{3+}M^{2+}B_5O_{10}$, $M^{2+}_2B_6O_{11}$, $M^{2+}B_8O_{13}$, $M^{2+}_2M^{3+}_2BO_{6.5}$, $M^{2+}_5B_2SiO_{10}$; where $M^{2+}$is Zn, Fe, Co, Ni, Cd, Cu and/or one or more alkaline-earth metals; $M^{3+}$is Al, Ga, In, Sc, Y, La and/or one or more rare-earth metals selected from Sc, Y, La, Ce, Pr, Nd, Pm, Sm, Eu, Gd, Tb, Dy, Ho, Er, Tm, Yb and Lu.

7. A light-converting material according to claim 6, wherein the alkaline earth-metals are Be, Mg, Ca, Sr and/or Ba.

8. A light-converting material according to claim 1, wherein the unactivated crystalline material is an unactivated crystalline aluminate, gallate or alumosilicate selected from the list consisting of $M^+AlO_2$, $M^{3+}AlO_3$, $M^{2+}M^{3+}AlO_4$, $M^{2+}Al_2O_4$, $M^{2+}Al_4O_7$, $M^+Al_5O_8$, $M^{3+}_4Al_2O_9$, $M^{3+}_3Al_5O_{12}$, $M+Al_{11}O_{17}$, $M^{2+}_2Al_{10}O_{17}$, $M^{3+}_3Al_5O_{12}$, $M^{3+}_3(Al,Ga)_5O_{12}$, $M^{3+}_3Sc_2Al_3O_{12}$, $M^{2+}_2Al_6O_{11}$, $M^{2+}Al_8O_{13}$, $M^{2+}M^{3+}Al_{11}O_{19}$, $M^{2+}Al_{12}O_{19}$, $M^{2+}_4Al_{14}O_{25}$, $M^{2+}_3Al_{16}O_{27}$, $M^{2+}Ga_2O_4$, $M^{2+}Ga_4O_7$, $M^{3+}_3Ga_5O_{12}$, $M^+Ga_{11}O_{17}$, $M^{2+}Ga_{12}O_{19}$, $M^+_2M^{2+}_3Al_2Si_2O_{10}$ and $M^{2+}_3Al_2Si_3O_{12}$; where $M^+$is one or more alkali metals; $M^{2+}$is Zn, Fe, Co, Ni, Cd, Cu and/or one or more alkaline-earth metals; $M^{3+}$ is Al, Sc, Y, La and/or one or more rare-earth metals selected from Sc, Y, La, Ce, Pr, Nd, Pm, Sm, Eu, Gd, Tb, Dy, Ho, Er, Tm, Yb and Lu; and X is one or more halogens.

9. A light-converting material according to claim 8, wherein the alkali metals are Li, Na and/or K; the alkaline-earth metals are Be, Mg, Ca, Sr and/or Ba; and the halogens are F, Cl, Br and/or I.

10. A light-converting material according to claim 1, wherein the unactivated crystalline material is an unactivated crystalline molybdate or tungstate selected from the list consisting of $M^{2+}MoO_4$, $M^+M^{3+}Mo_2O_8$, $M^{2+}WO_4$, $M^{2+}_3WO_6$, $M^{3+}_2W_3O_{12}$, $M^+M^{3+}W_2O_8$; where $M^+$is one or more alkali metals; $M^{2+}$ is Zn, Fe, Co, Ni, Cd, Cu and/or one or more alkaline-earth metals; $M^{3+}$is Al, Sc, Y, La and/or one or more rare-earth metals selected from Sc, Y, La, Ce, Pr, Nd, Pm, Sm, Eu, Gd, Tb, Dy, Ho, Er, Tm, Yb and Lu; and X is one or more halogens.

11. A light-converting material according to claim 10, wherein the alkali metals are Li, Na and/or K; the alkaline-earth metals are Be, Mg, Ca, Sr and/or Ba; and the halogens are F, Cl, Br and/or I.

12. A light-converting material according to claim 1, wherein the unactivated crystalline material is an unactivated crystalline complex metal-oxygen compound is selected from the list consisting of $M^{3+}AsO_4$, $M^{2+}_{13}As_2O_{18}$, $M^{2+}GeO_3$, $M^{2+}_2GeO_4$, $M^{2+}_4GeO_6$, $M^{2+}_4(Ge,Sn)O_6$, $M^{2+}_2Ge_2O_6$, $M^{3+}_4Ge_3O_{12}$, $M^{2+}_5GeO_4X_6$, $M^{2+}_8Ge_2O_{11}X_2$, $M^+InO_2$, $M^{2+}In_2O_4$, $M^+LaO_2$, $M^{2+}La_4O_7$, $M^{3+}NbO_4$, $M^{2+}Sc_2O_4$, $M^{3+}_2TaO_4$, $M^{2+}SnO_4$, $M^{3+}TaO_4$, $M^{2+}TiO_3$, $M^{2+}_2TiO_4$, $M^+_2M^{3+}_2Ti_3O_{10}$, $M^{2+}_5(VO_4)_3X$, $M^{3+}VO_4$, $M^{3+}(V,P)O_4$, $M^+YO_2$, $M^{2+}ZrO_3$, $M^{2+}_2ZrO_4$ and $M^{2+}M^{3+}_2ZrO_6$; where $M^+$ is one or more alkali metals; $M^{2+}$ is Zn, Fe, Co, Ni, Cd, Cu and/or one or more alkaline-earth metals; $M^{3+}$ is Al, Sc, Y, La, Bi and/or one or more rare-earth metals selected from Sc, Y, La, Ce, Pr, Nd, Pm, Sm, Eu, Gd, Tb, Dy, Ho, Er, Tm, Yb and Lu; $M^{4+}$ is Ti, Zr, Ge and/or Sn; and X is one or more halogens.

13. A light-converting material according to claim 12, wherein the alkali metals are Li, Na and/or K; the alkaline-earth metals are Be, Mg, Ca, Sr and/or Ba; and the halogens are F, Cl, Br and/or I.

14. A light-converting material according to claim 1, wherein the unactivated crystalline material is an unactivated crystalline sulfide, selenide or telluride selected from the list consisting of $M^{2+}S$, $M^{2+}(S,Te)$, $M^{2+}Se$, $M^{2+}Te$, $M^{2+}Ga_2S_4$, $M^{2+}Ba_2S_3$ and $M^{2+}Al_2S_4$; where $M^{2+}$ is Zn, Fe, Co, Ni, Cd, Cu and/or one or more alkaline-earth metals.

15. A light-converting material according to claim 14, wherein the alkaline-earth metals are Be, Mg, Ca, Sr and/or Ba.

16. A light-converting material according to claim 1, wherein the unactivated crystalline material is an unactivated crystalline oxysulfide or oxychloride compound selected from the list consisting of $M^{3+}OCl$ and $M^{3+}_2O_2S$; where $M^{3+}$ is Al, Sc, Y, La, and/or one or more rare-earth metals selected from Sc, Y, La, Ce, Pr, Nd, Pm, Sm, Eu, Gd, Tb, Dy, Ho, Er, Tm, Yb and Lu.

17. A light-converting material according to claim 1, wherein the unactivated crystalline material is an unactivated crystalline nitride, oxynitride or SiAlON selected from the list consisting of $M^{3+}N$, $M^{2+}Si_2O_2N_2$, $M^{2+}_2Si_5N_8$, $M^{3+}_3Si_6N_{11}$, $M^{2+}AlSiN_3$, α-sialons and β-sialons; where $M^{2+}$ is Zn, Fe, Co, Ni, Cd, Cu and/or one or more alkaline-earth metals; and $M^{3+}$ is Al, Ga, Sc, Y, La and/or one or more rare-earth metals selected from Sc, Y, La, Ce, Pr, Nd, Pm, Sm, Eu, Gd, Tb, Dy, Ho, Er, Tm, Yb and Lu.

18. A light-converting material according to claim 17, wherein the alkaline-earth metals are Be, Mg, Ca, Sr and/or Ba.

19. A light-converting material according to claim 1, wherein the semiconductor nanoparticles consist of at least two different semiconductor materials in an alloy, in a core/shell configuration or in a core/multishell configuration having at least two shells, where the core comprises either a semiconductor material or an alloy of at least two different semiconductor materials and the shell(s) comprise(s) independently a semiconductor material or an alloy of at least two different semiconductor materials.

20. A light-converting material according to claim 19, wherein a concentration gradient is present within the core and/or the shell(s) and/or between the core and/or the shell(s).

21. A light-converting material according to claim 1, wherein the semiconductor materials are selected from group II-VI semiconductors, group III-V semiconductors, group IV-VI semiconductors, group I-III-VI$_2$ semiconductors and from alloys and/or combinations of these semiconductors.

22. A light-converting material according to claim 21, wherein the semiconductor materials are doped with one or more transition metals.

23. A light-converting material according to claim 1, wherein the semiconductor nanoparticles are in the form of nanodots, nanorods, nanoflakes, nanotetrapods, nanodots in nanorods, nanorods in nanorods and/or nanodots in nanoflakes.

24. A light-converting material according to claim 1, wherein the surface of the light-converting material is coated with one or more coating materials.

25. A light-converting mixture comprising one or more of the light-converting materials according to claim 1.

26. A method for the partial or complete conversion of ultraviolet and/or blue light into light having a longer wavelength, comprising passing the light through a light-converting material of claim 1.

27. Light source containing at least one primary light source and at least one light-converting material according to claim 1.

28. Light source according to claim 27, wherein the light-converting material is arranged directly on the primary light source or is arranged on a support material remote from the primary light source.

29. A process for the production of a light source according to claim 27, where the light-converting material is applied to the primary light source or the support material in the form of a film by spin coating or spray coating or in the form of a film as laminate.

30. A lighting unit containing at least one light source according to claim 27.

* * * * *